(12) United States Patent
Zhang

(10) Patent No.: US 9,661,190 B2
(45) Date of Patent: May 23, 2017

(54) LOW LATENCY AND LOW COMPLEXITY PHASE SHIFT NETWORK

(71) Applicant: DOLBY LABORATORIES LICENSING CORPORATION, San Francisco, CA (US)

(72) Inventor: Yun Zhang, Olathe, KS (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 248 days.

(21) Appl. No.: 14/403,812

(22) PCT Filed: May 14, 2013

(86) PCT No.: PCT/US2013/040948
§ 371 (c)(1),
(2) Date: Nov. 25, 2014

(87) PCT Pub. No.: WO2013/180945
PCT Pub. Date: Dec. 5, 2013

(65) Prior Publication Data
US 2015/0109530 A1 Apr. 23, 2015

Related U.S. Application Data

(60) Provisional application No. 61/653,999, filed on May 31, 2012, provisional application No. 61/735,462, filed on Dec. 10, 2012.

(51) Int. Cl.
*H03H 17/04* (2006.01)
*H03H 17/08* (2006.01)
(Continued)

(52) U.S. Cl.
CPC .............. *H04N 5/04* (2013.01); *H03H 17/04* (2013.01); *H03H 17/08* (2013.01); *H03H 2017/009* (2013.01); *H03H 2017/0472* (2013.01)

(58) Field of Classification Search
CPC .............. H03H 17/04; H03H 17/0472; H03H 17/0072–17/009; H03H 17/08
See application file for complete search history.

(56) References Cited

U.S. PATENT DOCUMENTS 4,528,598 A * 7/1985 Trytko ................... H04N 9/64
348/712
5,903,480 A 5/1999 Lin
(Continued)

FOREIGN PATENT DOCUMENTS

CN 1879103 12/2006
CN 102104816 6/2011
(Continued)

OTHER PUBLICATIONS

Zhang et al., "Design of IIR digital allpass filters based on eigenvalue problem", IEEE Transactions on Signal Processing, vol. 47, No. 2, 1999.*
(Continued)

*Primary Examiner* — Matthew Sandifer

(57) ABSTRACT

A high performance, low complexity phase shift network may be created with one or more non-first-order all-pass recursive filters that are built on top of a plurality of first-order and/or second-order all-pass recursive filters and/or delay lines. A target time delay, whether large or small, may be specified as a constraint for a non-first-order all-pass recursive filter. A target phase response may be determined for the non-first-order all-pass recursive filter. Phase errors between the target phase response and a calculated phase response with filter coefficients of the non-first-order all-pass recursive filter may be minimized to yield a set of optimized values for the filter coefficients of the non-first-order all-pass recursive filter.

23 Claims, 16 Drawing Sheets

(51) Int. Cl.
   *H03H 17/00* (2006.01)
   *H04N 5/04* (2006.01)

(56) References Cited

U.S. PATENT DOCUMENTS

| | | |
|---|---|---|
| 6,526,429 B1 | 2/2003 | Lai |
| 6,751,277 B1 | 6/2004 | Pesquet-Popescu |
| 6,760,451 B1 | 7/2004 | Craven |
| 7,174,229 B1 | 2/2007 | Chen |
| 8,891,708 B2 | 11/2014 | McGrath |
| 2007/0174376 A1 | 7/2007 | George |
| 2009/0304213 A1 | 12/2009 | Cook |
| 2010/0266143 A1 | 10/2010 | Oliver |
| 2011/0150241 A1* | 6/2011 | Christoph ............... H04S 7/301 381/103 |

FOREIGN PATENT DOCUMENTS

| | | |
|---|---|---|
| GB | 1384610 | 2/1975 |
| JP | H06-303105 | 10/1994 |
| JP | 2003-505967 | 2/2003 |
| JP | 2007-067578 | 3/2007 |

OTHER PUBLICATIONS

Wei-Der Chang, "Phase response design of recursive all-pass digital filters using a modified PSO algorithm", Computational Intelligence and Neuroscience 2015, Article 8, Jan. 2015.*

Kidambi, "Weighted Least-Squares Design of Recursive Allpass Filters", IEEE Transactions on Signal Processing, vol. 44, No. 6, 199.*

Reddy, G.R. et al., "Digital All-Pass Filter Design Through Discrete Hilbert Transform," IEEE International Symposium on Circuits and Systems, IEEE New York, NY, USA, May 1-3, 1990, p. 646-649.

Tapia J. J. et al., "Frequency-Delay Domain Design of Stable All-Pass Digital Filters," Proceedings of the 43rd IEEE Midwest Symposium on Circuits and Systems, IEEE Piscataway, NJ, USA, Aug. 8-11, 2000, p. 74-78.

Kohut, P. et al., "Optimization Using Modified All-Pass Filters for Magnitude Compensation," AES Convention: 105, Paper No. 4755, Meyer Sound Laboratories, Berkeley, CA, USA, Sep. 1, 1998, p. 1-39.

Wada, S. et al., "Multichannel IIR Filter Banks Composed of All-Pass Filters as Construction Elements," Electronic and Communications in Japan, Part 3, vol. 75, No. 9, Nov. 1991, pp. 1637-1646.

* cited by examiner

Backward Process Filter (3 allpass filters)

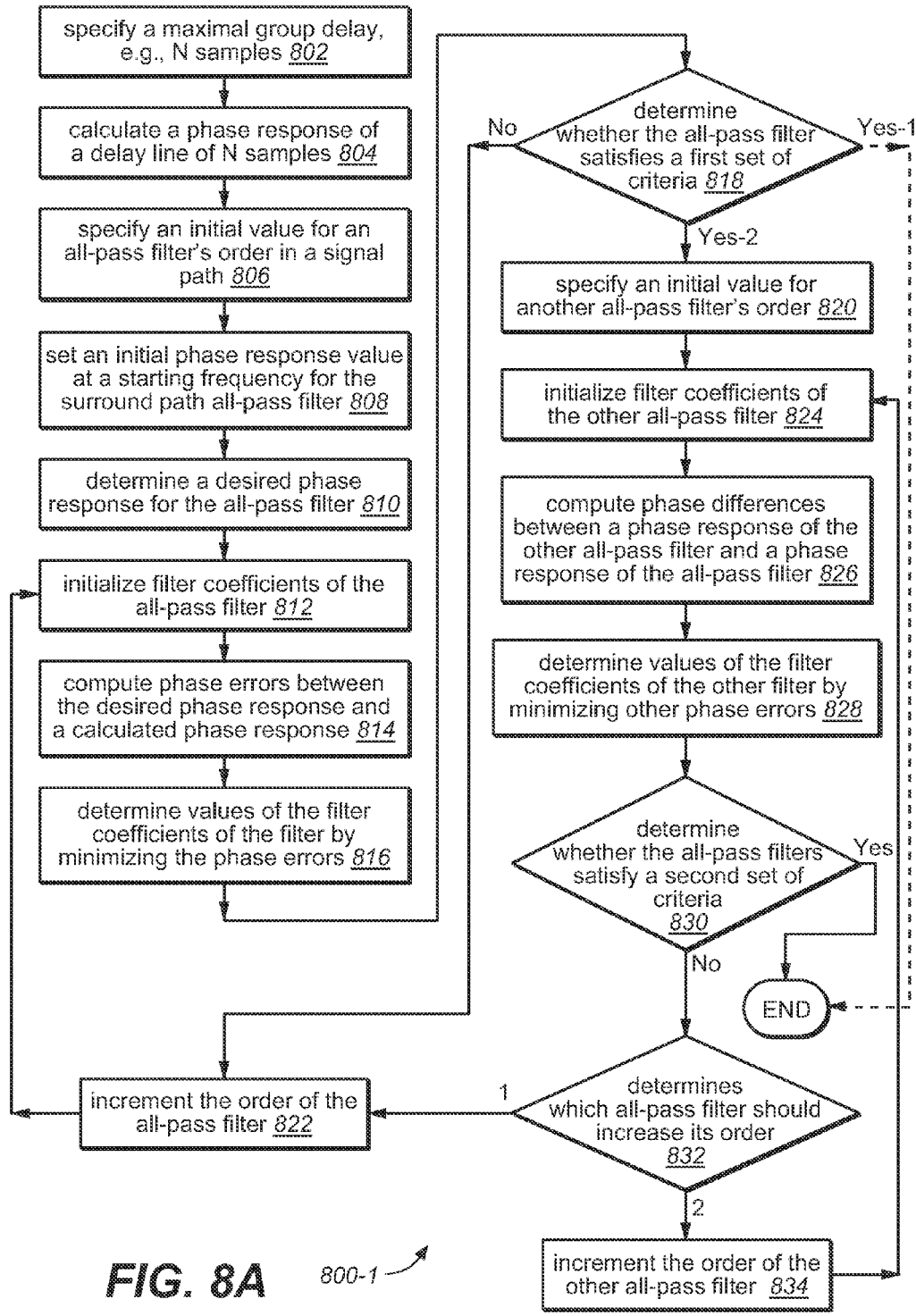
FIG. 8A  800-1

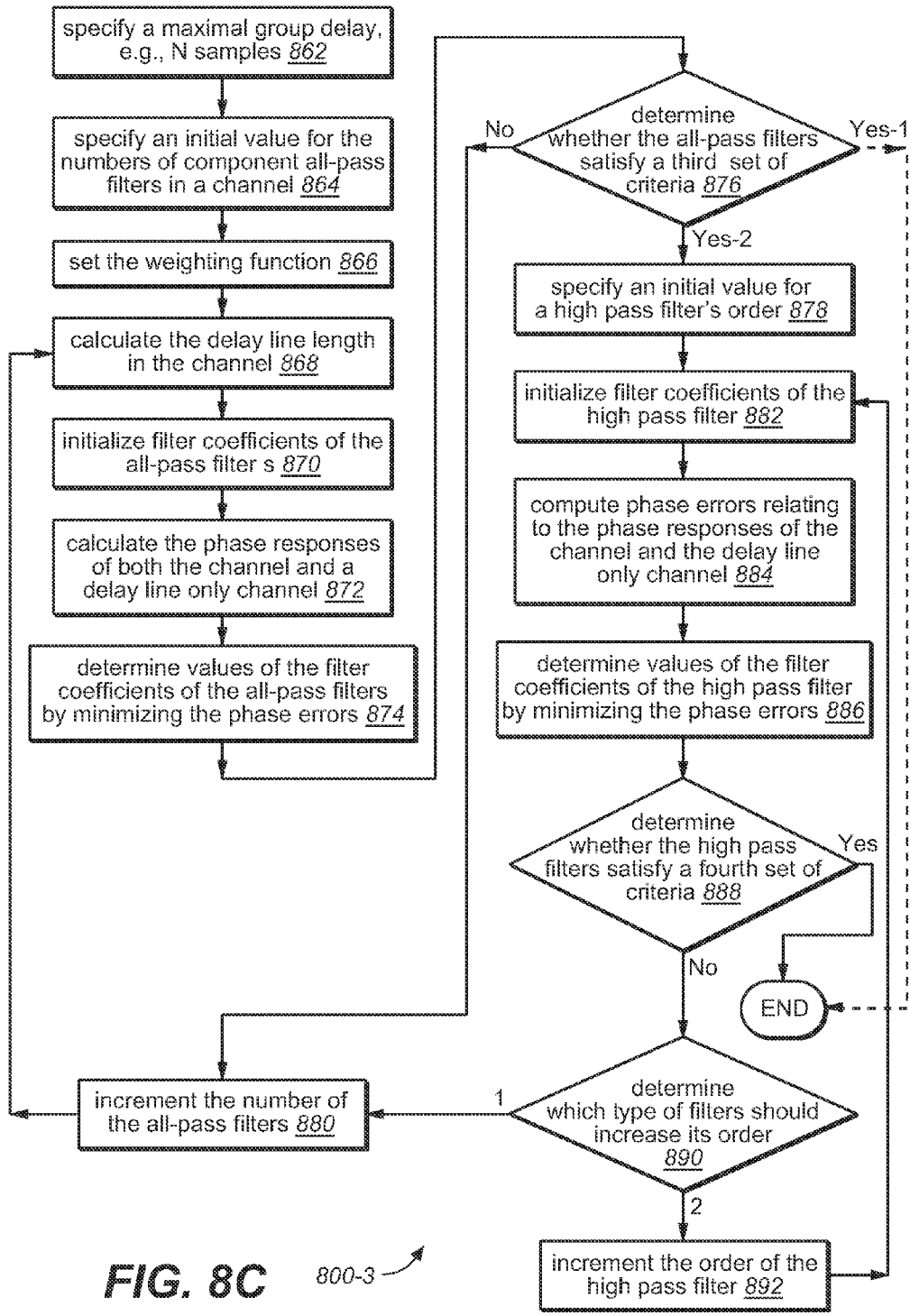
FIG. 8C  800-3

LOW LATENCY AND LOW COMPLEXITY PHASE SHIFT NETWORK

CROSS-REFERENCE TO RELATED APPLICATIONS

This application claims priority to U.S. Provisional Patent Application No. 61/653,999 filed 31 May 2012 and U.S. Provisional Patent Application No. 61/735,462, filed 10 Dec. 2012, each of which is hereby incorporated by reference in its entirety.

TECHNOLOGY

The present invention relates generally to processing audio and/or video signals. More particularly, an embodiment of the present invention relates to generating target phase shifts in audio and/or video signals.

BACKGROUND

Audio and video signals may be processed to obtain certain phase shifts among audio and video signals in different channels. The phase shifts may be exploited by multi-channel media systems to provide rich sound images that provide useful timing, depth, direction, and other localization cues to users so the users may realistically perceive sound sources in the sound images.

Existing filtering techniques may be used to generate phase shifts in audio and video signals in some (e.g., surround) channels relative to some other (e.g., front) channels. However, the existing filtering techniques may not generate phase shifts with a high degree of accuracy, especially in low and high audible frequencies, resulting in poor audio content rendering and/or low-quality sound images. The existing filtering techniques also may require complicated expensive logic, large memory consumption, and long computation time to perform phase shifts with accuracy. Resultant time delays under these techniques are often too large to be acceptable in certain media applications such as live broadcast. As a result, useful media processing features, even already installed in systems, typically have to be omitted or turned off to compensate for the large time delays required by these techniques. Complicated expensive logic required by these techniques may also limit their applications to only a relatively limited range of (e.g., high-end) computing devices.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which:

FIG. 8A, FIG. 8B and FIG. 8C illustrate example process flows, according to example embodiments of the present invention;

DESCRIPTION OF EXAMPLE EMBODIMENTS

Figure 1:
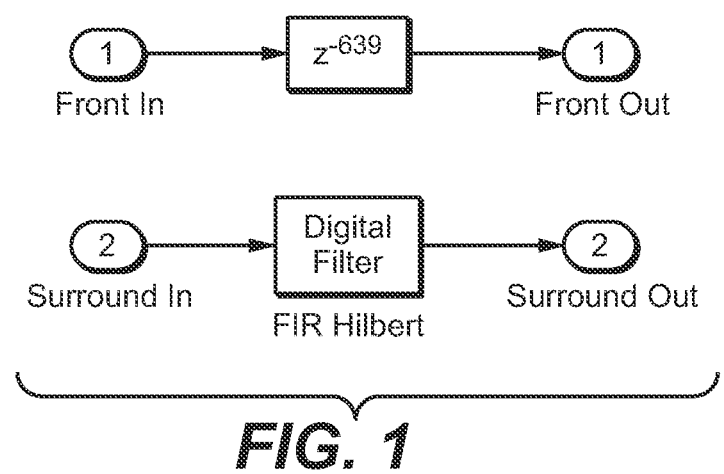
FIG. 1 illustrates a non-recursive finite-impulse-response (FIR) Hilbert filter that may be used to perform filtering operations relating to phase shift.

Example embodiments, which relate to low latency, low complexity phase shift networks, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:

1. GENERAL OVERVIEW
2. OTHER PHASE SHIFT APPROACHES
3. LOW COMPLEXITY LOW LATENCY PHASE SHIFT NETWORK
   3.1. EXAMPLE PHASE SHIFT NETWORKS
   3.2. PHASE SHIFT NETWORKS WITH DELAY LINE ONLY CHANNELS
4. EXAMPLE FILTER OPTIMIZATION SYSTEM
5. EXAMPLE PROCESS FLOW
6. EXAMPLE FILTER NETWORKS
7. IMPLEMENTATION MECHANISMS—HARDWARE OVERVIEW
8. EQUIVALENTS, EXTENSIONS, ALTERNATIVES AND MISCELLANEOUS

1. General Overview

This overview presents a basic description of some aspects of an example embodiment of the present invention. It should be noted that this overview is not an extensive or exhaustive summary of aspects of the example embodiment. Moreover, it should be noted that this overview is not intended to be understood as identifying any particularly significant aspects or elements of the example embodiment, nor as delineating any scope of the example embodiment in particular, nor the invention in general. This overview merely presents some concepts that relate to the example embodiment in a condensed and simplified format, and should be understood as merely a conceptual prelude to a more detailed description of example embodiments that follows below.

A high performance, low complexity phase shift network may be used to perform phase shifting operations in a media processing system comprising multiple audio channels. The phase shift network may be configured to operate with low time delay. The phase shift network comprises one or more non-first-order all-pass recursive filters. Each, some, or all, of the non-first-order all-pass recursive filters may be built with first-order and/or second order all-pass recursive filters.

In some embodiments, a target time delay may be specified for a group of all-pass recursive filters. A target phase response may be specified or developed for the all-pass recursive filters. The target phase response may be specified or developed based at least in part on a phase response of a delay line that generates a time delay that is comparable to the target time delay. The target phase response may include a target phase shift (e.g., +/−90 degrees, or other degrees). Factors such as maximum allowable group delays over a wide bandwidth of audio frequencies or at a number of frequencies may also be considered in developing the target phase response to ensure high fidelity media outputs (e.g., audio outputs).

A transfer function may be used to describe a group of all-pass recursive filters. The transfer function may be factorized into a form that comprises a numerator and a denominator corresponding to the zeros and poles of filter coefficients. One or more of a wide variety of techniques may be used to search optimized values for the set of filter coefficients. For example, phase errors may be computed and evaluated between the target phase response and calculated responses based on a plurality of sets of values for the set of filter coefficients. In some embodiments, the phase errors may be minimized to locate a set of optimized values for the set of filter coefficients for the non-first-order all-pass recursive filter. Some or all of these operations may be repeated iteratively and/or recursively to ensure that a final set of optimized values for the set of filter coefficients produces a phase response that meets one or more performance criteria.

Performance criteria as described herein may include, without limitation, phase errors and maximum allowable group delays at the low end, intermediate regions, or the high end, of a bandwidth of audio frequencies.

The same techniques may be applied to generate a phase shift network comprising one or more non-first-order all-pass recursive filters. Each of the non-first-order all-pass recursive filters may be implemented with first-order and/or second-order all-pass recursive filters. Additionally, optionally, or alternatively, the non-first-order all-pass recursive filters may be implemented with minimal numbers of first-order and/or second-order all-pass recursive filters and may be configured to satisfy constraints that relevant performance criteria are individually and/or collectively satisfied by the non-first-order all-pass recursive filters or by the phase shift network as a whole.

Time delays of the phase shift networks described herein are sufficiently brief to sustain real time media applications, which may be precluded with phase shift networks that have longer time delays. The performance characteristics, simplicity, and low latency allow use of the phase shift network with high quality audio and media systems and applications.

Particularly, as non-first-order filters in the phase shift network may be implemented with a relatively small number of first-order and/or second-order all-pass recursive filters, a phase shift network as described herein may be readily implemented on a variety of computing devices to operate over a spectrum of audio frequencies, to provide high quality, low cost multi-channel audio processing capability, and to support a wide variety of media applications (e.g., real time media applications).

In some example embodiments, mechanisms as described herein form a part of a media processing system, including but not limited to any of: a theater system, a studio system, an auditorium system, a sports broadcast system, an audio system, a multimedia system, a handheld device, game machine, television, laptop computer, netbook computer, tablet computer, cellular radiotelephone, electronic book reader, point of sale terminal, desktop computer, computer workstation, computer kiosk, or various other kinds of terminals and media processing units.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2. Other Phase Shift Approaches

Media systems may use multiple channels to deliver better quality sounds (e.g., in terms of sound source localization) to a listener than a system that uses only one or two channels. Some of the multiple channels (e.g., one or more surround channels) may present phase-shifted audio signals relative to audio signals in some others (e.g., two or more front channels). Different types of filters may be used to generate phase shifts in media signals (e.g., audio and/or video signals).

FIG. 1 illustrates a non-recursive (FIR) Hilbert filter that may be used to perform filtering operations relating to phase shift (e.g., +/−90 degrees; 90 and 270 degrees, etc.). The FIR Hilbert filter, commercially available from Dolby Laboratories, Inc., of San Francisco, Calif., may have 1279 taps and generate a corresponding delay of 639 samples, to generate a phase shift of 90 degrees in an output signal (surround out) based on a corresponding input signal (surround in). The FIR Hilbert filter may perform its filtering operations in a frequency domain, and hence may need to use forward and inverse Fourier transforms (e.g., FFT and inverse FFT). As illustrated, in a media system that uses this FIR Hilbert filter to generate phase shifts in one or more surround channels, an output signal (front out) in front channels may simply be delayed from a corresponding input signal (front in) by 639 samples to match the delay introduced by the FIR Hilbert filter in the surround channels.

Figure 2:
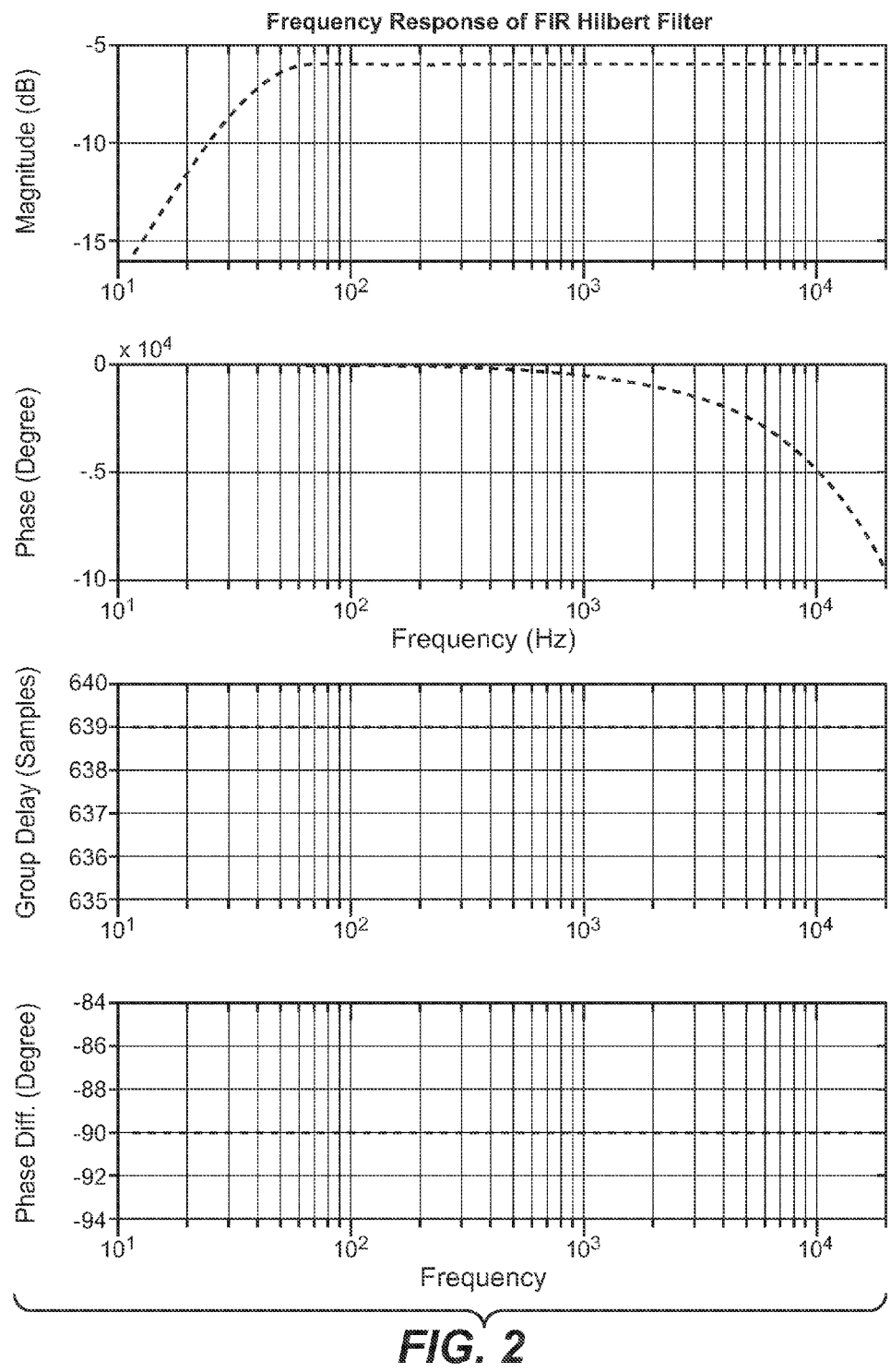
FIG. 2 illustrates a frequency response of a FIR Hilbert filter.

FIG. 2 illustrates an example frequency response of a FIR Hilbert filter (e.g., as illustrated in FIG. 1) in magnitude, phase, group delay, and phase shift/difference (e.g., in relation to a delay line in a front signal path as illustrated in FIG. 1). As shown, in terms of magnitude, the FIR Hilbert filter has a cutoff frequency of 30 Hz, and a good frequency response except in the very low frequencies below the cutoff frequency. The FIR Hilbert filter generates a perfect 90 degree phase shift/difference in relation to the delay line in the front signal path and a constant group delay that is matched by a delay line in the front signal path.

However, the FIR Hilbert filter involves relatively high latency and complexity, as it requires $N_{fft}$ words per channel for a transfer function corresponding to the FIR Hilbert filter for surround channels, $(N_{fft}+N_{fft}/4)$ words per channel for a delay line for front channels, $2*N_{fft}$ or $N_{fft}$ (for in-place FFT/IFFT) words per channel for FFT/IFFT for surround channels, where $N_{fft}=1024$ is the FFT/IFFT size. The number of operations for FFT/IFFT is estimated to be in the order of $2*N_{fft}*\log(N_{fft})$ per channel. In addition, $N_{fft}$ multiplications per surround channel, and $N_{fft}$ memory access and move per front channel may be needed in the filtering operation of the FIR Hilbert filter.

Figure 3A:
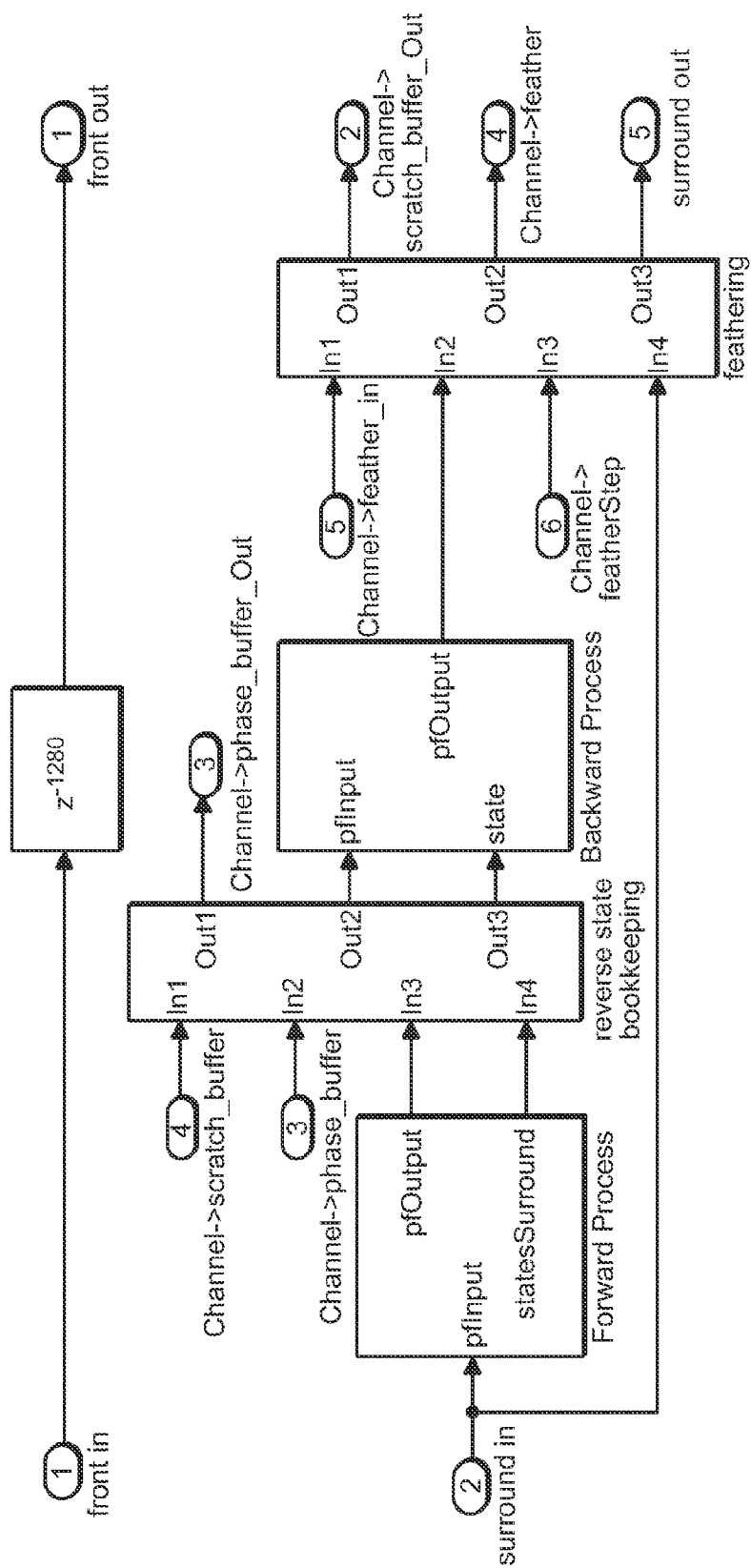
FIG. 3 illustrates a recursive infinite-impulse-response (IIR) Hilbert filter that may be used to perform filtering operations relating to phase shift.

FIG. 3A illustrates a recursive (IIR) Hilbert filter that may be used to perform filtering operations relating to phase shift (e.g., +/−90 degrees; 90 and 270 degrees, etc.). The IIR Hilbert filter, commercially available from Dolby Laboratories, Inc., San Francisco, Calif., may have a latency of 1280 samples, to generate a phase shift of 90 degrees in an output signal (surround out) based on a corresponding input signal (surround in). The IIR Hilbert filter may perform its filtering operations in a time domain, and hence may omit the use of forward and inverse Fourier transforms. As illustrated, in a media system that uses this IIR Hilbert filter to generate phase shifts in one or more surround channels, an output signal (front out) in front channels may simply be delayed from a corresponding input signal (front in) by 1280 samples to match the delay introduced by the IIR Hilbert filter in the surround channels.

Figure 3B:
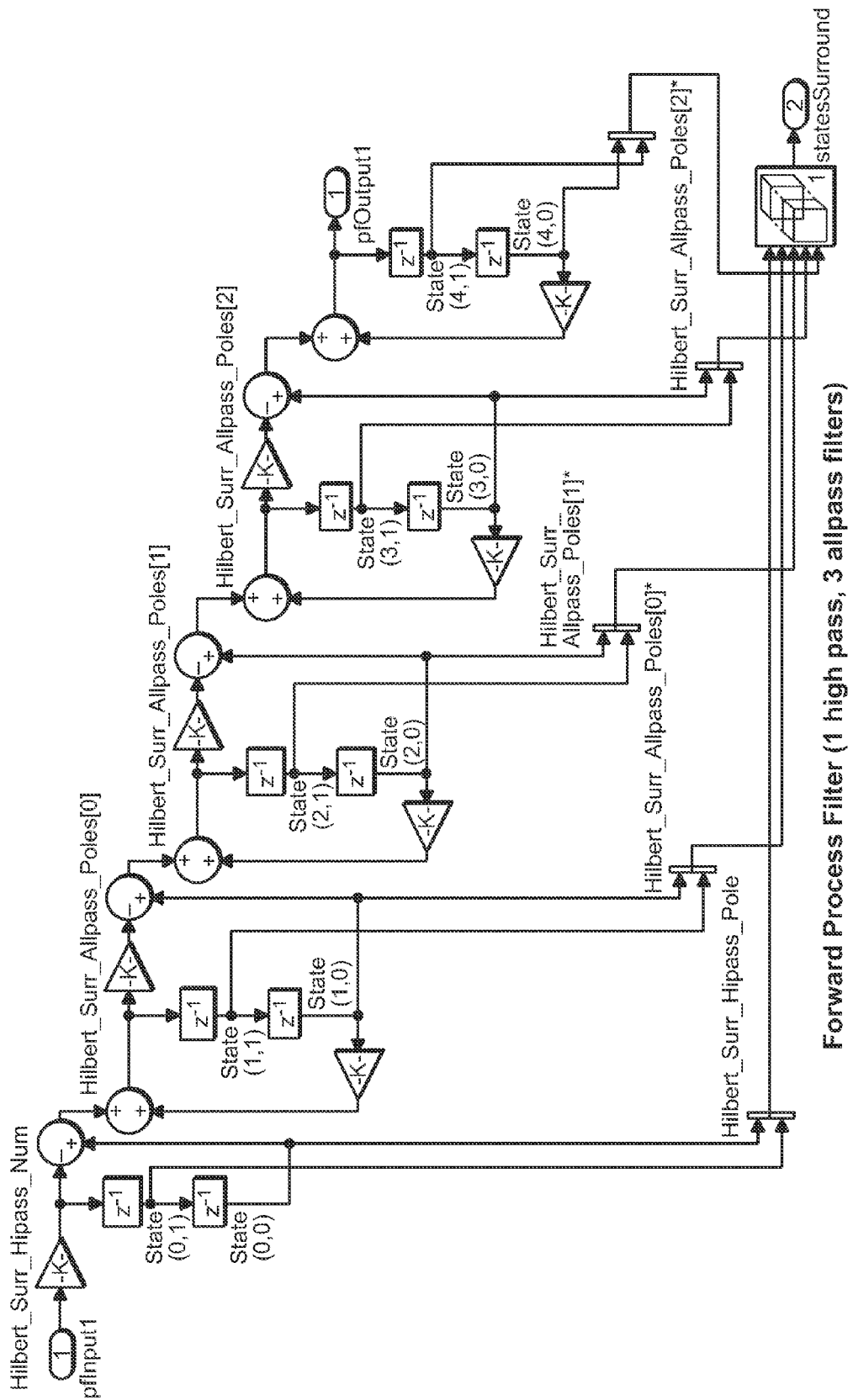
Figure 3C:
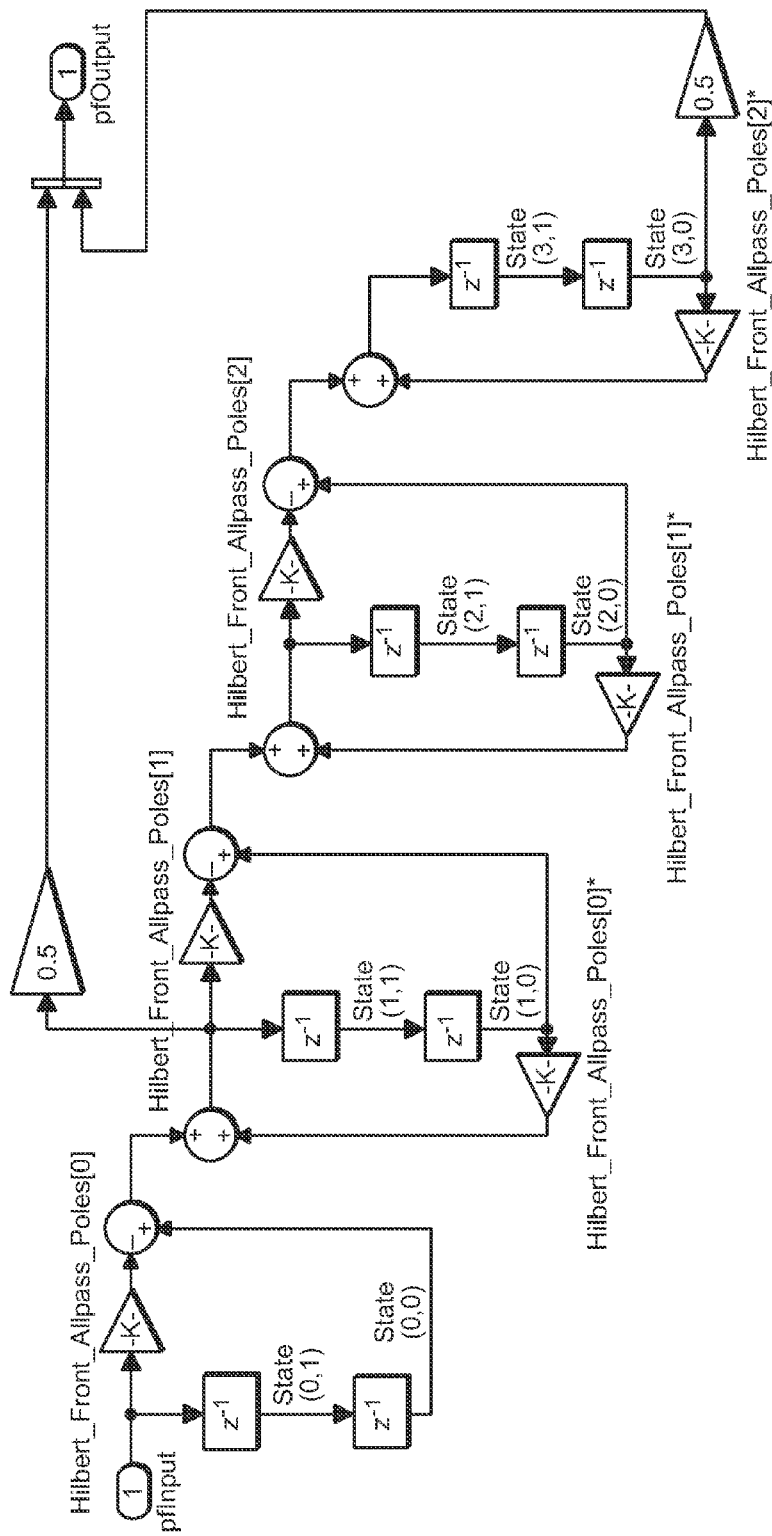

The IIR Hilbert filter comprises a forward process filter, a backward process filter, state reverse logic and bookkeeping logic. In an example implementation, as illustrated in FIG. 3B, the forward process filter may comprise four component filters; the first of the four component filters is a 2nd order high pass IIR filter, and other three component filters are 2nd order all-pass IIR filter. As illustrated in FIG. 3C, the backward process filter may comprise three 2nd order all-pass IIR filters.

Figure 4:
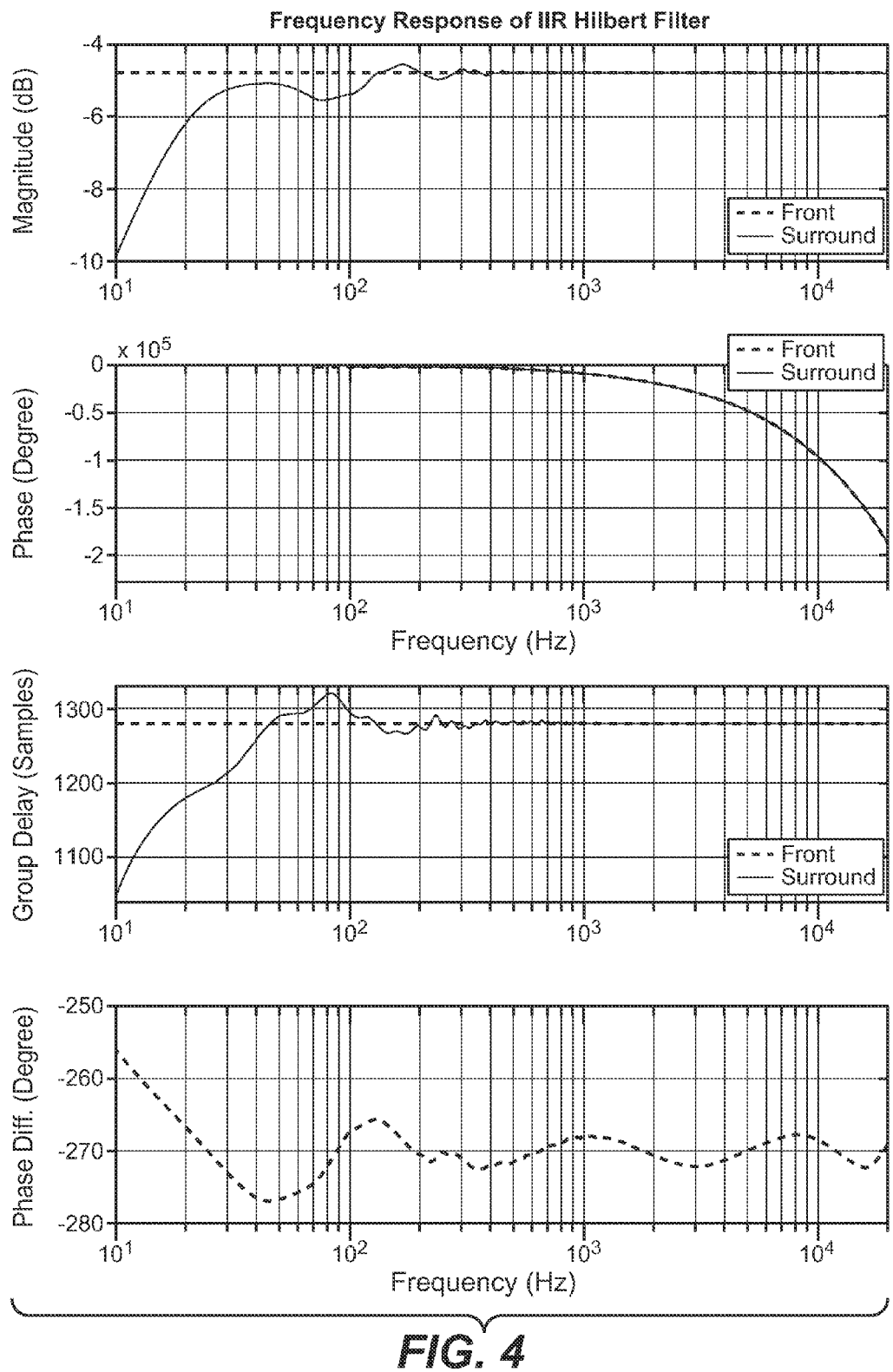
FIG. 4 illustrates a frequency response of an IIR Hilbert filter.

FIG. 4 illustrates an example frequency response of an IIR Hilbert filter (e.g., as illustrated in FIG. 3A through FIG. 3C) in magnitude, phase, group delay, and phase shift/difference (e.g., in relation to a delay line in a front signal path as illustrated in FIG. 3A). As shown, the frequency response below 100 Hz in this example implementation is not good because of the high pass filter. The IIR Hilbert filter generates a 270 degree (or negative 90 degrees) phase shift/difference with a certain amount of phase distortion in relation to the delay line in the front signal path and also generates a group delay that approximately matches the delay line in the front signal path.

However, like the FIR Hilbert filter, the IIR Hilbert filter involves relatively high latency. In the example implementation, the IIR Hilbert filter requires 22 words for coefficients, 18 words for filter states per surround channel, and 1280 words for delay line per front channel.

Figure 5:
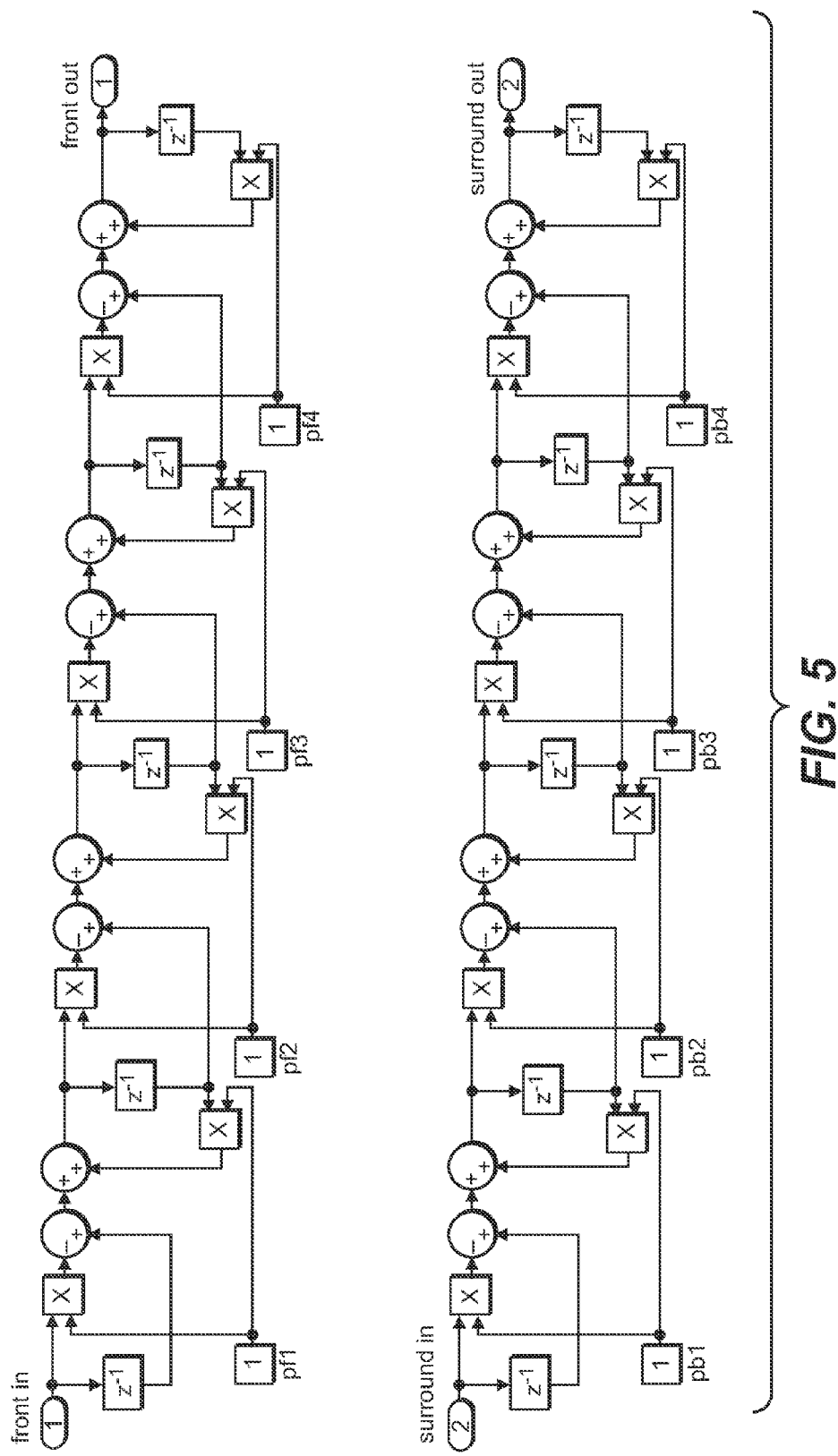
FIG. 5 illustrates an all-pass recursive filter that may be used to perform filtering operations relating to phase shift.

FIG. 5 illustrates an all-pass IIR filter (e.g., DP600, commercial available from Dolby Laboratories, Inc., of San Francisco, Calif.) that may be used to perform filtering operations relating to phase shift (e.g., +/−90 degrees; 90 and 270 degrees, etc.). This phase shift filter is used in pro-encoder. The all-pass IIR filter may comprise four first-order IIR filters in both front channels and surround channels, have a latency of about 100 samples, and generate a phase difference of 90 degrees between the front channels and the surround channels.

Figure 6:
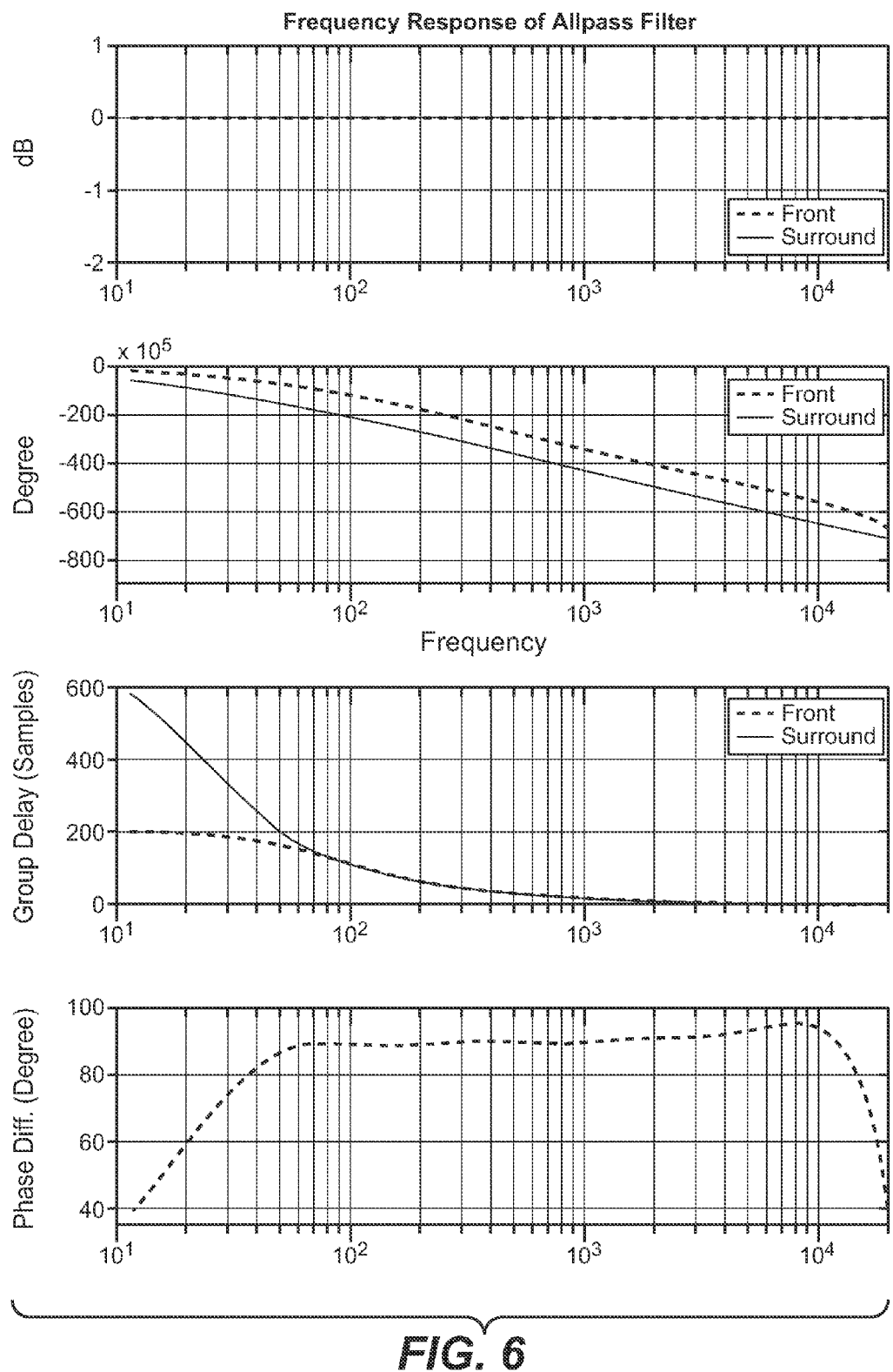
FIG. 6 illustrates a frequency response of an all-pass recursive filter.

FIG. 6 illustrates an example frequency response of an all-pass IIR filter (e.g., as illustrated in FIG. 5) in magnitude, phase, group delay, and phase shift/difference between front channels and surround channels. As shown, the frequency response has a flat magnitude response, and a nearly linear phase response. The phase difference below 10 kHz is nearly constant 90 degrees. However, the phase response above 10 kHz is problematic, as indicated by a phase difference of 40 degree at 20 kHz.

However, unlike the FIR Hilbert filter and the IIR Hilbert filter, the all-pass IIR filter involves relatively low latency and complexity with a group delay of about 100 samples. In the example implementation, the all-pass IIR filter requires 8 words for coefficient, 5 words per channel for filter states.

3. Low Complexity Low Latency Phase Shift Network

Techniques as described herein may be used to generate a phase shift network with a flat (perfect) magnitude response and a nearly linear phase response within a wide bandwidth of audible frequencies. In sharp contrast to other phase shifting techniques that either have high accuracy but high complexity and high latency, or have low latency and low complexity but low accuracy, phase shift networks generated by the techniques as described herein may be used to produce phase shift with high accuracy, high audio quality, low latency, and low complexity.

3.1. Phase Shift Networks with all Pass Filters in Both Front and Surround Channels Under techniques as described herein, a phase shift network may comprise a set of recursive all-pass filters with a Z transform as follows:

$$H(z) = \frac{b(0) + b(1)*z^{-1} + \ldots + b(N-1)*z^{-(N-1)} + z^{-N}}{1 + b(N-1)*z^{-1} + \ldots + b(1)*z^{-(N-1)} + b(0)*z^{-N}} \quad (1)$$

where N represents the all-pass filter's order. The Z transform may be represented by two sets of arrays, $$H(z) = z^N * \frac{B*Z}{B*Z^*} \quad (2)$$

where $B=[b(0), b(1), \ldots, b(N-1), b(N)]$, $Z=[z^0, z^{-1}, \ldots, z^{-(N-1)}, z^{-N}]$, $Z^*$ (e.g., conjugate of Z) comprises an array of elements that represent inverses of elements in the array of Z, and b(N) is 1. In some embodiments, the transfer function's poles and the transfer function's zeros form a plurality of pairs of a corresponding pole and a corresponding zero. As a result, the all-pass filter may be implemented by N first-order all-pass filters or by N/2 second-order all-pass filters if N is even, or by one first-order and (N−1)/2 seconder-order all-pass filter if N is odd.

The phase shift network may comprise one, two, or more first and/or second order all-pass filters. Two or more lower order all-pass filters may be implemented with a higher order filter in some embodiments. In some embodiments, the phase shift network may comprise a first all-pass filter for a front signal path and a second all-pass filter for a surround signal path to produce a phase difference between the front signal path and the surround signal path. Z transforms for the first and second all-pass filters may be as follows:

$$H_m(z) = z^{Nm} * \frac{B_m * Z_m}{B_m * Z_m^*} \quad (3)$$

$$H_s(z) = z^{Ns} * \frac{B_s * Z_s}{B_s * Z_s^*} \quad (4)$$

where the indexes m and s are for the front signal path and the surround path, respectively. $N_m$ and $N_s$ represent the filter orders for the front signal path and the surround path, respectively. $B_m$ and $B_s$ represent the filter coefficient arrays for the front signal path and the surround signal path, respectively.

In some embodiments, some or all of the coefficients (e.g., $B_s$ and/or $B_m$) in the all-pass filters may be constrained to be in real domains to ensure a flat (perfect) magnitude response. In some embodiments, at least one of the coefficients (e.g., $B_s$ and/or $B_m$) in the all-pass filters may comprise an imaginary part. Respective phase responses for the first all-pass filter and the second all-pass filters may be represented with analytic forms as follows:

$$\varphi_m(w, B_m) = N_m * w + arctg\left(\frac{H_{mi}(w, B_m)}{H_{mr}(w, B_m)}\right) \quad (5)$$

$$\varphi_s(w, B_s) = N_s * w + arctg\left(\frac{H_{si}(w, B_s)}{H_{sr}(w, B_s)}\right) \quad (6)$$

where w denotes frequency; arctg denotes an arc tangent function; $H_{mi}(w, B_m)$ and $H_{si}(w, B_s)$ denote imaginary parts of $H_m$ and $H_s$, respectively; and $H_{mr}(w, B_m)$ and $H_{sr}(w, B_s)$ denote real parts of $H_m$ and $H_s$, respectively.

A phase difference dφ between a delay line of N samples and the surround signal path at a given frequency w may be obtained based on expression (6), as follows:

$$d\varphi(w, B_s) = (N - N_s) * w - arctg\left(\frac{H_{si}(w, B_s)}{H_{sr}(w, B_s)}\right) \quad (7)$$

A phase difference dφ between a given phase Φ(w) and the surround signal path at a given frequency w may be obtained based on expression (6), as follows:

$$d\varphi(w, \Phi(w), B_s) = (N * \Phi(w) - N_s * w) - arctg\left(\frac{H_{si}(w, B_s)}{H_{sr}(w, B_s)}\right) \quad (8)$$

A phase difference dφ between the front signal path and the surround signal path at a given frequency w may be obtained based on expressions (5) and (6), as follows:

$$d\varphi(w, B_m, B_s) = \quad (9)$$
$$(N_m - N_s) * w + arctg\left(\frac{H_{mi}(w, B_m)}{H_{mr}(w, B_m)}\right) - arctg\left(\frac{H_{si}(w, B_s)}{H_{sr}(w, B_s)}\right)$$

In some embodiments, phase related expressions (5) through (9) may be used to generate values for $B_m$ and $B_s$ such that both the first and second all-pass filters have nearly linear phase responses and that the phase difference between these all-pass filters is a certain value such as π/2 or −π/2 in a wide spectrum of audible frequencies such as over a bandwidth between 20 Hz and 20 kHz, as follows:

$$\text{minimize} \sum_{i=1}^{K} [D\Phi i - d\varphi(w_i, B_m, B_s)]^2 \quad (10)$$

over $$B_m(0), B_m(1) \ldots, B_m(N_m - 1) \, B_s(0), B_s(1), \ldots, B_s(N_s - 1)$$

where Dφi represents a desired phase difference at an i-th frequency $w_i$; and K represents the total number of frequencies at which phase errors between the phase difference and the desired phase difference are summed (and minimized). In some embodiments, Dφi is set to π/2 or −π/2 for all $w_i$, where i is 1, 2, ... K−1, and K.

In some embodiments, the first all-pass filter in the front signal path may be replaced by a delay line of N samples. In these embodiments, instead of using expression (10) values for $B_s$ may be generated by the following expression (11):

$$\text{minimize} \sum_{i=1}^{K} [D\Phi i - d\varphi(w_i, B_s)]^2 \quad (11)$$

over $$B_s(0), B_s(1), \ldots, B_s(N_s - 1)$$

3.2. Phase Shift Networks with Delay Line Only Channels

In some embodiments, a phase shift network may comprise delay lines only in one type of channel such as front channels. This may be used, for instance, in broadcast media applications.

Techniques as described herein may be used to provide high accuracy, low complexity and low latency phase networks in media processing systems that comprise two or more types of channels. Such a media processing system may comprise (e.g., one, two or more) front and (e.g., one, two, or more) surround channels. In some embodiments, the system is configured with a phase shift network that comprises only a delay line in a front channel. The phase shift network further comprises a delay line and a set of all-pass filters, in a surround channel. Additionally or optionally, the phase shift network may comprise a high pass filter in the surround channel. The delay line in the surround channel can be configured to make the derivative of the phase response of the surround channel to approximate (e.g., to be as close as possible to, etc.) the derivative of the phase response of the front channel through coarse estimation. The all-pass filters in the surround channel can be configured to perform the phase shift of π/2 through fine estimation. Additionally or optionally, a high pass filter in the surround channel can be configured to prevent or reduce phase deviation in low frequencies (e.g., 30 Hz, 40 Hz, 50 Hz, etc.) and remove very low (e.g., near 0, DC, etc.) frequencies. The phase shift network may be configured to provide a flat magnitude response and a linear or nearly linear phase response over a wide bandwidth of audio frequencies or at a number of frequencies, thereby providing high audio quality, configurable latency, and low complexity.

The delay line in the front channel has the following Z transform, where N (in units of sample) is the latency target for the phase shift network:

$$H_f(z) = z^{-N} \quad (1')$$

The all-pass filters in the surround channel may comprise recursive all-pass filters with perfect magnitude response and a nearly linear phase response. In some embodiments, in the surround channel, the phase shift network comprises a delay line with a delay of K samples, a set of first- and second-order all-pass filters with a Z transform of $H_{ap}(z)$. Additionally or optionally, in the surround channel, the phase shift network comprises a high pass filter with a Z transform of $H_{hp}(z)$.

Accordingly, in some embodiments, a phase shift network in one (e.g., a surround channel) of its channels may be represented with a Z transform as follows:

$$H_s(z) = z^{-K} H_{ap}(z) H_{hp}(z) \tag{2'}$$

$$H_{ap}(z) = \prod_{m=0}^{M_2-1}\left(\frac{b_{ap2}(m)+z^{-2}}{1+b_{ap2}(m)*z^{-2}}\right) * \prod_{m=0}^{M_1-1}\left(\frac{b_{ap1}(m)+z^{-1}}{1+b_{ap1}(m)*z^{-1}}\right) \tag{3'}$$

$$H_{hp}(z) = \frac{\sum_{l=0}^{L} b_{hp}(l)*z^{-1}}{\sum_{l=0}^{L} a_{hp}(l)*z^{-1}} \tag{4'}$$

where $M_1$ and $M_2$ are the numbers of first- and second-order all-pass filter respectively, and L is the order of the high pass filter.

The total group delay in the surround channel is $K+2*M_2+M_1+D$, where D is the group delay of the high pass filter. In some embodiments, the group delays of the front channel (with only a delay line of N samples) and surround channel are configured to be same, as follows:

$$K+2*M_2+M_1+D=N \tag{5.1'}$$

In some embodiments, N may be minimized by setting K to a minimal value (e.g., 0, etc.), for example, as shown in the following expression:

$$2*M_2+M_1+D=N \tag{5.2'}$$

Alternatively, the Z transform of the all-pass filters in the surround channel can be represented by two sets of arrays, as follows:

$$H_{ap}(z) = z^{2*M_2+M_1} * \frac{B_{ap2}*Z_{ap2}}{B_{ap2}*Z_{ap2}^*} * \frac{B_{ap1}*Z_{ap1}}{B_{ap1}*Z_{ap1}^*} \tag{6'}$$

where $B_{ap2}=[b_{ap2}(0), b_{ap2}(1), \ldots, b_{ap2}(2M_2-1), b_{ap2}(2M_2)]$, $Z_{ap2}=[z^{-0}, z^{-1}, \ldots, z^{-2M_2-1}, z^{-2M_2}]$, and $Z_{ap2}^*$ (e.g., conjugate of $Z_{ap2}$) comprises an array of elements that represent inverses of elements in the array of $Z_{ap2}$. The values of $b_{ap2}(1)$, $b_{ap2}(3)$, . . . , $b_{ap2}(2M_2-1)$ are zeros, whereas the value of $b_{ap2}(2M_2)$ is one (1). $B_{ap1}=[b_{ap1}(0), b_{ap1}(1), \ldots, b_{ap1}(M_1-1), b_{ap1}(2M_1)]$, $Z_{ap1}=[z^{-0}, z^{-1}, \ldots, z^{M_1-1}, z^{M_1}]$, and $Z_{ap1}^*$ (e.g., conjugate of $Z_{ap1}$) comprises an array of elements that represent inverses of elements in the array of $Z_{ap1}$. The value of $b_{ap1}(M_1)$ is one (1).

The Z transform of the high pass filters in the surround channel can be represented by two sets of arrays, as follows:

$$H_{hp}(z) = \frac{B_{hp}*Z_{hp}}{A_{hp}*Z_{hp}} \tag{7'}$$

where $B_{hp}=[b_{hp}(0), b_{hp}(1), \ldots, b_{hp}(L-1), b_{hp}(L)]$, and $Z_{hp}=[z^{-0}, z^{-1}, \ldots, z^{L-1}, z^L]$.

The phase response of the front channel is as follows:

$$\phi_f(w) = -N*w \tag{8'}$$

The phase response of the surround channel is shown below, where $H_{api}(\ )$ and $H_{apr}(\ )$ are the imaginary and real part of the all-pass filter $H_{ap}(\ )$ respectively; and $H_{hpi}(\ )$ and $H_{hpr}(\ )$ are the imaginary and real part of the high pass filter $H_{hp}(\ )$ respectively, as follows:

$$\varphi_s(w, B_{ap}, B_{hp}, A_{hp}) = \tag{9'}$$
$$-K*w + arctg\left(\frac{H_{api}(w, B_{ap})}{H_{apr}(w, B_{ap})}\right) + arctg\left(\frac{H_{hpi}(w, B_{hp}, A_{hp})}{H_{hpr}(w, B_{hp}, A_{hp})}\right)$$

A phase difference dφ between a delay line of N samples in the front channel (or signal path) and the surround channel (or signal path) at a given frequency w may be obtained based on expressions (8') and (9'), as follows:

$$d\varphi(w, B_{ap}, B_{hp}, A_{hp}) = \tag{10'}$$
$$(-N+K)*w - arctg\left(\frac{H_{api}(w, B_{ap})}{H_{apr}(w, B_{ap})}\right) - arctg\left(\frac{H_{hpi}(w, B_{hp}, A_{hp})}{H_{hpr}(w, B_{hp}, A_{hp})}\right)$$

In some embodiments, phase related expressions (8') through (10') may be used to generate values for $B_{ap}$, $B_{hp}$ and $A_{hp}$ such that the surround channel has a nearly linear phase response and that the phase difference between the front channel and the surround channel is (e.g., nearly) a certain value such as π/2 or −π/2 in a wide spectrum of audible frequencies such as over a bandwidth between 20 Hz and 20 kHz, as follows:

$$\text{minimize} \sum_{i=0}^{W-1} \text{weight}(w_i) * [D\Phi i - d\varphi(w_i, B_{ap}, B_{hp}, A_{hp})]^2 \tag{11'}$$

where Dφi represents a desired phase difference (e.g., π/2, etc.) at an i-th frequency $w_i$; and W represents the total number of frequencies at which phase errors between the phase difference and the desired phase difference are summed (and minimized). Weight is a function of frequency $w_i$. In some embodiments, minimization of the phase error is performed with a non-linear constraint that all the zeros and poles are inside the unit circle in the z-space.

4. Example Filter Optimization System

Figure 7:
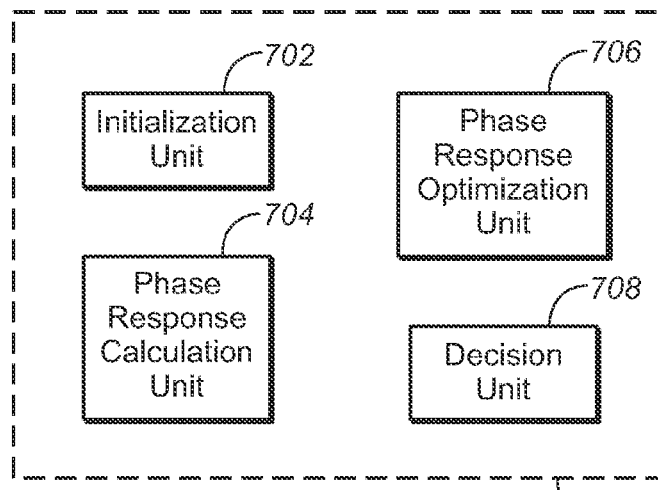
FIG. 7 illustrates an example of an optimized phase shift system design.

FIG. 7 illustrates an example filter optimization system (700) for determining a high performance, low delay and low complexity phase shift network, according to an example embodiment. In some embodiments, the filter optimization system (700) comprises an initialization unit (702), a phase response calculation unit (704), a phase response optimization unit (706), and a decision unit (708). The initialization unit (702) may be configured to receive initialization parameters from user or system input. The initialization parameters may include but are not limited to any of: time constraints, audio frequency constraints, high fidelity audio reproduction constraints, operational parameters, thresholds, etc., used in subsequent operations. The phase response calculation unit (704) may be able to calculate a phase response of an all-pass filter based on explicit values or implicit (e.g., parameterized) values of filter coefficients of the all-pass filter. The phase response optimization unit (706) may be configured to implement one or more optimization algorithms and to search for values of filter coefficients based on target functions, cost functions, phase difference functions, phase error functions, etc. The decision unit (708) may be configured to make decisions at one or more decision points of one or more process flows employed to determine the high performance, low delay and low complexity phase shift network.

5. Example Process Flow

FIG. 8A illustrates an example process flow (800-1) for determining a high performance, low delay and low complexity phase shift network, according to an example embodiment. In some embodiments, a filter optimization system (e.g., 700 of FIG. 7) comprising one or more computing devices (e.g., 900 of FIG. 9) may perform this process flow (800-1).

In block 802, the filter optimization system (700) specifies a maximal group delay, for example, N in number of samples. The maximal group delay may be specified based on one or more selection factors. Examples of selection factors may include, but are not limited to any of: types of supported media applications, types of supported media devices, performance characteristics of media, etc. For example, a maximal group delay specified for live broadcast applications or systems may be relatively small in relation to a maximal group delay specified for media applications based on stored media content. Additionally, optionally, or alternatively, human audio perception may be considered in setting the maximal group delay. For example, the maximal group delay specified may be specified below a threshold above which human audio perception may notice a difference in audio quality and/or an overall time delay. Additionally, optionally, or alternatively, other operational parameters including but not limited only to any of design parameters may be set in block 802. For example, a starting frequency and/or an ending will frequency may be set in block 802 for a bandwidth of audio frequencies over which the phase shift network is to operate.

In block 804, the filter optimization system (700) calculates a phase response of a delay line with a delay of N samples.

In block 806, the filter optimization system (700) specifies an initial value for an all-pass filter's order in a signal path. In embodiments in which two or more all-pass filters are used in front and surround signal paths, respectively, the all-pass filter here may be one of the two or more all-pass filters. For the purpose of illustration only, the all-pass filter is a surround path all-pass filter whose order is specified with the initial value (denoted as $N_s$) in block 806.

In block 808, the filter optimization system (700) sets an initial phase response value at a starting frequency for the surround path all-pass filter. The starting frequency (e.g., 20 Hz, 30 Hz, 50 Hz, 100 Hz, or another frequency) may be, for example, specified in block 802 as a part of operational parameters for the process flow (800-1). The initial phase response value at the starting frequency for the surround path all-pass filter may be set to the same value as that of the phase response of the delay line at the starting frequency.

In block 810, the filter optimization system (700) determines a desired phase response for the surround path all-pass filter. This may be performed, for example, with integration or summation operations over a bandwidth of continuous audio frequencies or over a set of discrete audio frequencies. An ordered set of audio frequencies, $w_1$, $w_2, \ldots, w_{K-1}$, and $w_K$, may be specified over the bandwidth of audio frequencies. For each frequency segment delineated by two neighboring audio frequencies $w_i$ and $w_{i+1}$, a desired value or functional (e.g., a linear functional) may be specified for the group delay within that frequency segment. The desired value or functional for the group delay may represent a maximum group delay, an average group delay, etc., in the frequency segment, and may be configured to ensure high fidelity audio reproduction within the frequency segment. For example, the desired value or functional for the group delay may be configured to ensure that the group delay is below or substantially below 3.2 millisecond at 500 Hz; 2 millisecond at 1 kHz; 1 millisecond at 2 kHz; etc. In some embodiments, the desired phase response may also be set the same as that of the delay line.

In some embodiments, the desired phase response for the surround path all-pass filter may be specified as a single curve over the bandwidth of audio frequencies. In some embodiments, the desired phase response for the surround path all-pass filter may be specified as two (e.g., minimal and maximal) or more curves over the bandwidth of audio frequencies. In some embodiments, the desired phase response for the surround path all-pass filter may be specified as a functional that corresponds to a range of curves and comprise a number of configurable parameters (e.g., starting frequency, ending frequency, group delays at individual audio frequencies, etc.).

In some embodiments, the desired phase response for the surround path all-pass filter may be specified nearly linear. As used herein, "nearly linear" may refer to a slope or a rate of change that varies within a small configurable range; for example, the variation of slopes within a nearly linear segment is less than 1%, 5%, 10%, etc. of the slope of a line segment configured to approximate the nearly linear segment.

In some embodiments, another all-pass filter may be deployed in a counterpart front path to the surround path. In some other embodiments, in place of another all-pass filter in a front path, the delay line of N samples may be directly deployed in the counterpart front path. In the embodiments in which the delay line is deployed in the front path instead of another all-pass filter, the desired phase response for the surround path all-pass filter may be configured to yield a desired phase difference between the delay line in the front path and the surround path all-pass filter in the surround path. This desired phase difference may be 90 degrees, 270 degrees, −90 degrees, etc.

A wide variety of techniques may be used to search (e.g., in all or a part of complex domains, real domains, etc.) for best values of filter coefficients of an all-pass filter with a certain order that minimizes phase errors of the all-pass filter in relation to a desired phase response. Examples of these techniques may include, but are not limited to any of, gradient based methods, finite difference based methods, Hessians-matrix based methods, interpolation based methods, etc. One or more of these techniques may be used to determine filter coefficients $B_s$ of the surround path all-pass filter using phase errors of the filter in relation to a desired phase response of the filter as a target function (or cost function).

In block 812, the filter optimization system (700) initializes the filter coefficients $B_s$ of the surround path all-pass filter, for example, to starting values appropriate to the techniques adopted for locating optimal values of the filter coefficients $B_s$.

In block 814, the filter optimization system (700) computes the phase errors between the desired phase response (e.g., as determined in block 810) and a phase response calculated based on the filter coefficients $B_s$. In some embodiments, one or more of the phase errors at one or more given frequencies may be represented by expression (11).

In block 816, the filter optimization system (700) determines values of the filter coefficients $B_s$ by locating a global minimum of the phase errors (e.g., as determined in block 814) between the desired phase response (e.g., as determined in block 810) and a phase response (e.g., as represented by expression (6)) calculated based on the filter coefficients $B_s$. In some embodiments, in block 816, the values of the filter coefficients are obtained by solving one or more inverse problems in an iterative process and/or recursive process.

In some embodiments, one or more operations as described herein may be optional and/or may be omitted. In some embodiments, one or more operations as described herein may be repeated iteratively and/or recursively. For example, one or more of the operations, such as initializing values of the filter coefficients, computing the phase errors, and minimizing the phase errors, performed in blocks 812, 814 and 816 may be repeated iteratively and/or recursively.

In block 818, the filter optimization system (700) determines whether the surround path all-pass filter with the values of the filter coefficients $B_s$—e.g., corresponding to the minimum of the phase errors—satisfies a first set of criteria. In some embodiments, the values of the filter coefficients $B_s$ as determined in block 816 may be used to compute explicitly the phase response of the surround path all-pass filter. The filter optimization system (700) may be configured to determine whether the explicitly computed phase response indicates that the surround path all-pass filter provides acceptable linearity, group delay and/or other response characteristics, for example, by comparing quantities relating to the phase response with the first set of criteria.

If it is determined that the surround path all-pass filter with the values of the filter coefficients $B_s$ satisfies the first set of criteria, then the process flow (800-1) goes to block 820 in embodiments in which another all-pass filter may be deployed in a counterpart front path to the surround path, and ends in other embodiments in which the delay line of N samples may be directly deployed in the counterpart front path in place of another all-pass filter. Otherwise, the process flow (800-1) goes to block 822.

In block 822, the filter optimization system (700) increments the order of the surround path all-pass filter by an integer value, for example, one (1). The process flow (800-1) goes to block 812 to perform/repeat the operations with the new order of the surround path all-path filter, as previously described.

In block 820, the filter optimization system (700) specifies an initial value for another all-pass filter's order. In some embodiments, the other all-pass filter is a filter whose phase response may need to be related (e.g., +/−90 degrees in phase difference) to that of the all-pass filter whose coefficients are determined in the discussion above. In embodiments in which two or more all-pass filters are used in front and surround signal paths, respectively, the other all-pass filter here may be one of the two or more all-pass filters. For the purpose of illustration only, the other all-pass filter is a front path all-pass filter whose order is specified with the initial value (denoted as $N_m$) in block 820.

In block 824, the filter optimization system (700) initializes the filter coefficients $B_m$ of the front path all-pass filter, for example, to starting values appropriate to the techniques adopted for locating optimal values of the filter coefficients $B_m$.

In block 826, the filter optimization system (700) computes phase differences between a phase response (which may be determined based on the optimized filter coefficients $B_s$ in block 818) of the surround path all-pass filter and a phase response calculated based on the filter coefficients $B_m$, as represented by expression (9). In some embodiments, one or more of the phase errors at one or more given frequencies may be calculated based on the phase differences between the surround path all-pass filter and the front path all-pass filter, as represented in expression (10).

In block 828, the filter optimization system (700) determines values of the filter coefficients $B_m$ by locating a global minimum of the phase errors (e.g., as determined in block 826). Additionally, optionally, or alternatively, values of the filter coefficients $B_s$ may or may not be re-determined in block 828. In some embodiments, in block 828, the values of the filter coefficients are obtained by solving one or more inverse problems in an iterative process and/or recursive process.

In some embodiments, one or more operations as described herein may be optional and/or may be omitted. In some embodiments, one or more operations as described herein may be repeated iteratively and/or recursively. For example, one or more of the operations, such as initializing values of the filter coefficients, computing the phase errors, and minimizing the phase errors, performed in blocks 824, 826 and 828 may be repeated iteratively and/or recursively.

In block 830, the filter optimization system (700) determines whether the surround path all-pass filter and the front path all-pass filter satisfy a second set of criteria. In some embodiments, the values of the filter coefficients $B_m$ as determined in block 828 may be used to compute explicitly the phase response of the front path all-pass filter. The filter optimization system (700) may be configured to determine whether the explicitly computed phase responses of the front path all-pass filter and the surround path all-pass filter indicate that the phase difference between the front path all-pass filter and the surround path all-pass filter is within one or more acceptable ranges (which may be specified with one or more criteria in the second set of criteria) over the bandwidth of audible frequencies. Additionally, optionally, or alternatively, the filter optimization system (700) may be configured to determine whether the explicitly computed phase response of the front path all-pass filter indicates that the front path all-pass filter provides acceptable linearity, group delay and/or other response characteristics, for example, by comparing quantities relating to the phase response with one or more criteria in the second set of criteria.

If it is determined that the surround path all-pass filter and the front path all-pass filter satisfy a second set of criteria, the process flow (800-1) ends. Otherwise, the process flow (800-1) goes to block 832.

In block 832, the filter optimization system (700) determines which of the surround path all-pass filter and the front path all-pass filter should increase its order. If it is determined that the order $N_m$ of front path all-pass filter should be increased, the process flow (800-1) goes to block 834. Otherwise, the process flow (800-1) goes to block 822. In some embodiments, the filter optimization system (700) may be biased to increment the order $N_m$ of front path all-pass filter until the order $N_m$ of front path all-pass filter reaches a configured threshold. In some embodiments, the filter optimization system (700) may be biased to increment the order $N_s$ of surround path all-pass filter until the order $N_s$ of the surround path all-pass filter reaches a configured threshold. In some embodiments, the filter optimization system (700) may be biased to set $N_m$ and $N_s$ in approximately same values. One or more of the configured threshold for $N_m$ and/or the configured threshold for $N_s$ may be defined as a fixed absolute integer number, or a relative number (e.g., within a configured difference or functional value between $N_m$ and $N_s$) or a ratio (e.g., a ratio of $N_m$ over $N_s$), etc. Thus, the one or more of the configured thresholds for $N_m$ and/or the configured threshold for $N_s$ may or may not be dependent on the current value of the order of their counterpart filter.

In block 834, the filter optimization system (700) increments the order of the front path all-pass filter by an integer value, for example, one (1). The process flow (800-1) goes to block 812 to perform/repeat the operations with the new order of the front path all-path filter, as previously described.

Figure 8B:
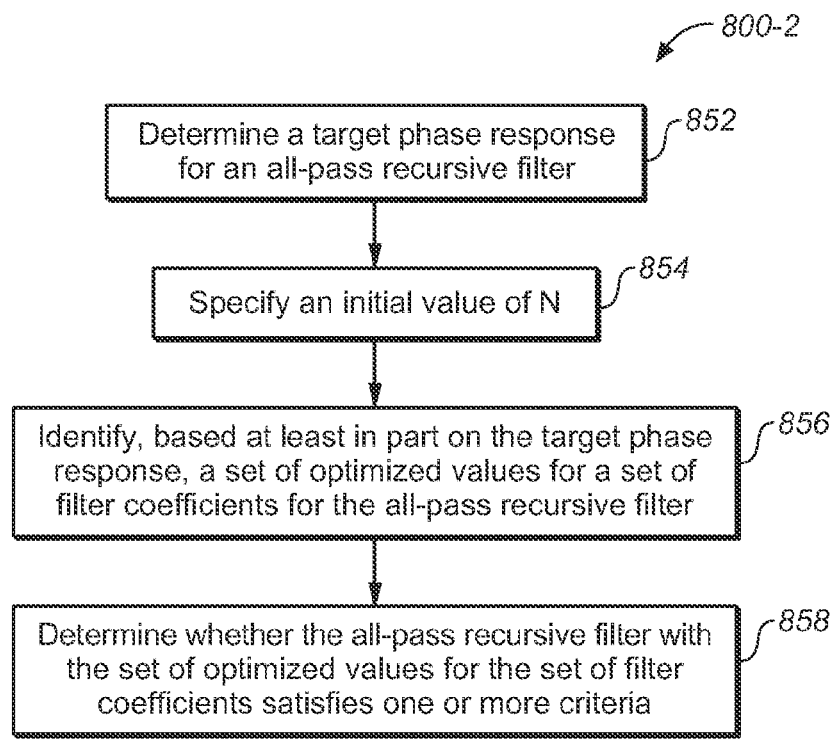

FIG. 8B illustrates an example process flow (800-2) for determining a high performance and low complexity phase shift network, according to an example embodiment. In some embodiments, a filter optimization system (e.g., 700 of FIG. 7) comprising one or more computing devices (e.g., 900 of FIG. 9) may perform this process flow (800-2).

In block 852, the filter optimization system (700) determines a target phase response for an all-pass recursive filter, the all-pass recursive filter being representable with a transfer function having N zeros and N poles, the N zeros having a 1-1 correspondence relationship with the N poles.

In block 854, the filter optimization system (700) specifies an initial value of N.

In block 856, the filter optimization system (700) identifies, based at least in part on the target phase response, a set of optimized values for a set of filter coefficients for the all-pass recursive filter.

In block 858, the filter optimization system (700) determines whether the all-pass recursive filter with the set of optimized values for the set of filter coefficients satisfies one or more criteria.

In an embodiment, the filter optimization system (700) is further configured to perform: in response to determining that the all-pass recursive filter with the set of optimized values for the set of filter coefficients does not satisfy the one or more criteria, incrementing N and repeating steps in blocks 856 and 858.

In an embodiment, the filter optimization system (700) is further configured to perform, in response to determining that the all-pass recursive filter with the set of optimized values for the set of filter coefficients satisfies the one or more criteria: determining another target phase response for a combination of the all-pass recursive filter and another all-pass recursive filter, the other all-pass recursive filter being representable with another transfer function having N' zeros and N', the N' zeros having a 1-1 correspondence relationship with the N' poles; specifying an initial value of N'; (i) identifying, based at least in part on the other target phase response, another set of optimized values for another set of filter coefficients for the other all-pass recursive filter; and (ii) determining whether the all-pass recursive filter with the set of optimized values for the set of filter coefficients and the other all-pass recursive filter with the other set of optimized values for the other set of filter coefficients satisfy one or more other criteria. In an embodiment, the filter optimization system (700) is further configured to perform, in response to determining that the all-pass recursive filter with the set of optimized values for the set of filter coefficients and the other all-pass recursive filter with the other set of optimized values for the other set of filter coefficients do not satisfy the one or more other criteria, incrementing N' and repeating steps (i) and (ii).

In an embodiment, the filter optimization system (700) is further configured to perform, in response to determining that the all-pass recursive filter with the set of optimized values for the set of filter coefficients and the other all-pass recursive filter with the other set of optimized values for the other set of filter coefficients do not satisfy the one or more other criteria, incrementing N and repeating steps in blocks 856 and 858.

In an embodiment, the filter optimization system (700) is further configured to perform: processing media samples, in a first signal path of two or more signal paths of a media processor, with the all-pass recursive filter; and processing media samples, in a second different signal path of the two or more signal paths of the media processor, with the other all-pass recursive filter.

In an embodiment, the filter optimization system (700) is further configured to insert a delay line as a part of one of the first signal path or the second signal path.

In an embodiment, the filter optimization system (700) is further configured to perform: processing media samples, in a first signal path of two or more signal paths of a media processor, with the all-pass recursive filter; and processing media samples, in a second different signal path of the two or more signal paths of the media processor, with a delay line without another all-pass recursive filter.

In an embodiment, to determine whether the all-pass recursive filter with the set of optimized values for the set of filter coefficients satisfies one or more criteria, the filter optimization system (700) is further configured to perform: determining phase errors relating to at least one of the target phase response for the all-pass recursive filter or phase responses calculated based on a plurality of sets of values for the set of filter coefficients for the all-pass recursive filter; and minimizing the phase errors to identify the set of optimized values, among the plurality of sets of values, for the set of filter coefficients.

In an embodiment, the filter optimization system (700) is further configured to compute the phase errors over a plurality of discrete audio frequencies.

In an embodiment, the filter optimization system (700) is further configured to compute the phase errors over a bandwidth of audio frequencies.

In an embodiment, the one or more criteria comprises one or more maximum phase errors at one or more of audio frequencies between 20 Hz and 400 Hz, audio frequencies between 400 Hz and 10,000 Hz, audio frequencies between 10,000 Hz and 25,000 Hz, audio frequencies greater than 25,000 Hz.

In an embodiment, the one or more criteria comprises one or more maximum group delays at one or more of audio frequencies between 20 Hz and 400 Hz, audio frequencies between 400 Hz and 10,000 Hz, audio frequencies between 10,000 Hz and 25,000 Hz, audio frequencies greater than 25,000 Hz.

In an embodiment, the filter optimization system (700) is further configured to determine the target phase response, for the all-pass recursive filter, based at least in part on a target phase difference between two outputs from two signal paths of a media processor.

In an embodiment, the filter optimization system (700) is further configured to convert one or more input media samples represented, received, transmitted, or stored with one or more input media signals into one or more output media samples represented, received, transmitted, or stored with one or more output media signals.

In an embodiment, at least one of the input media signals or the output media signals comprises a video signal.

In an embodiment, the all-pass recursive filter comprises at least a part of a signal channel of a media processor to process media samples, and wherein the signal channel represents one of surround channels, front channels, or non-surround non-front channels.

In an embodiment, the filter optimization system (700) is further configured to implement the all-pass recursive filter N first-order all-pass recursive filters, or by N/2 and second-order all-pass filters if N is even, or by one first-order and (N−1)/2 seconder-order all-pass filter if N is odd.

In an embodiment, at least one of the set of optimized values comprises one of a real part or an imaginary part.

In various example embodiments, a system, an apparatus, or one or more other computing devices performs any or a part of the foregoing methods as described.

In an embodiment, a phase shift network comprises an all-pass recursive filter with filter coefficients optimized with any or a part of the foregoing methods as described.

In an embodiment, a phase shift network comprises one or more non-first-order all-pass recursive filters; at least one of the non-first-order all-pass recursive filters comprises one or more first-order and/or second-order all-pass recursive filters; a target time delay is specified for the first-order and the non-first-order all-pass recursive filters; and the phase shift network develops a target phase response based, at least in part, on a delay line phase response, which generates a time delay that is comparable to the target time delay.

In an embodiment, the target phase shift comprises an angle that has a substantially quadrature relationship with a phase of an input signal of the network.

In an embodiment, the network target phase response is developed based further on a maximum allowable group delay over one or more of: a continuous band of audio frequencies; or a number of discrete audio frequencies.

In an embodiment, the phase shift network comprises one or more groups of at least one of the non-first-order all-pass recursive filters or the first-order and/or second-order all-pass recursive filters; the one or more groups are characterized by a filter transfer function that represents zeros and poles of a set of filter coefficients. In an embodiment, values of the set of filter coefficients are optimized based on a phase error, which is evaluated between the target phase response and a plurality of filter coefficient values for the set of filter coefficients. In an embodiment, the phase error is minimized.

In an embodiment, the one or more non-first-order all-pass recursive filters comprise finite impulse response filters.

In an embodiment, one or more semiconductor integrated circuits including but not limited to ASIC and FPGA may be used to implement a phase shift network as described herein.

FIG. 8C illustrates an example process flow (800-3) for determining a high performance, low delay and low complexity phase shift network comprising at least a delay line only channel and a separate channel with all-pass filters, according to an example embodiment. In some embodiments, a filter optimization system (e.g., 700 of FIG. 7) comprising one or more computing devices (e.g., 900 of FIG. 9) may perform this process flow (800-3).

In block 862, the filter optimization system (700) specifies a maximal group delay, e.g., N in number of samples, in the phase shift network. The maximal group delay may be the available latency for the phase shift network and may be specified based on one or more group delay selection factors as discussed above in connection with process flow 800-1.

In block 864, the filter optimization system (700) specifies an initial value for the number ($M_1$) of first-order all-pass filters and/or an initial value for the number ($M_2$) of second-order all-pass filters in a specific channel (e.g., surround channel). A value for the number of first-order or second-order all-pass filters may be set based on one or more order selection factors relating to accuracy and complexity. For example, a higher value for the number of first-order all-pass filters or second-order all-pass filters increases accuracy but also complexity. In some embodiments, the initial value for the number of second-order all-pass filters may be set to 3, 4, 5, 6, 7, etc., as a tradeoff between accuracy and complexity. As illustrated in expression (3'), the number of first-order all-pass filters may be denoted as $M_1$, whereas the number of second-order all-pass filters may be denoted as $M_2$.

In block 866, the filter optimization system (700) sets the weighting function to be used in filter coefficient optimization operations. This may be defined with a continuous function over a bandwidth of continuous audio frequencies or a set of discrete weighting function values over a set of discrete audio frequencies. As illustrated in expression (11'), a weighting function, weight ( ), may be specified for an ordered set of audio frequencies, $w_0, w_1, w_2, \ldots,$ and $w_{W-1}$, over the bandwidth of audio frequencies. For each of the frequencies, $w_i$, a desired value or functional weight $(w_i)$ may be specified for the weighting function weight ( ). The desired value or functional for the weighting function weight ( ) may be configured to emphasize high fidelity audio reproduction within a frequency segment. In some embodiments, a weighting function weight ( ) may comprise two constant weighting values, respectively, for a first frequency segment of 100 Hz to 1 kHz and a second frequency segment of 1 kHz to 20. Depending on which frequency segment is to be emphasized, a first constant weighting value of the two constant weighting values may be set as a ratio (e.g., 1/30, 1/20, 1/10, 1, 10, 20, 30, etc.) of a second constant weighting value of the two constant weighting values.

In block 868, the filter optimization system (700) calculates for the delay line length in the specific channel (e.g., surround channel). As illustrated in expression (5.1'), the delay line length may be denoted as K. D in expressions (5.1') and (5.2') may be initialized (e.g., before block 866) to zero (0). In some embodiments, K is constrained between a non-zero positive ceiling value (e.g., 40, 30, 20, 10, 5, a larger or smaller value, etc.) and zero (0). In some embodiments, K is set at 0 (zero). In subsequent calculations in which a high pass filter is present in the surround channel, D may be computed in accordance with the high pass filter's coefficients.

In block 870, the filter optimization system (700) initializes the filter coefficients of the first-order all-pass filters and/or the second-order all-pass filters to starting values appropriate to the techniques adopted for locating optimal values of the filter coefficients. The filter coefficients of the first-order all-pass filters and/or the second-order all-pass filters may be set based on one or more filter coefficient selection factors relating to achieving as close a phase response as to (−N+K)*w for the first-order all-pass filters and/or the second-order all-pass filters. As illustrated in expression (6'), the filter coefficients of the first-order all-pass filters may be denoted as $B_{ap1}$, whereas the filter coefficients of the second-order all-pass filters may be denoted as $B_{ap2}$.

In block 872, the filter optimization system (700) calculates the phase responses of the channel (e.g., surround channel) and a delay-line only channel (e.g., front channel) based at least in part on the filter coefficients $B_{ap1}$ and/or $B_{ap2}$. Expressions (8') and (9') may be used in the calculation of the phase responses. The phase response term of a high pass filter $H_{hp}$ in expression (9') may be initialized (e.g., before block 866) to zero (0). In subsequent calculations in which a high pass filter is present in the surround channel, the phase response term of a high pass filter $H_{hp}$ may be computed in accordance with the high pass filter's coefficients.

A wide variety of techniques may be used to search (e.g., in all or a part of complex domains, real domains, etc.) for best values of filter coefficients $B_{ap1}$ and/or $B_{ap2}$ that minimize phase errors of the second-order all-pass filters in relation to a desired phase difference (e.g., $\pi/2$, etc.) between the surround channel and the front channel, for example, based on expression (11'). Examples of these techniques may include, but are not limited to any of: gradient based methods, finite difference based methods, Hessians-matrix based methods, interpolation based methods, etc. One or more of these techniques may be used to determine filter coefficients $B_{ap1}$ and/or $B_{ap2}$ using phase errors of the filters in relation to a desired phase difference (e.g., $\pi/2$, etc.) between the surround channel and the front channel (as illustrated in expression (11')) as a target function (or cost function).

In block 874, the filter optimization system (700) determines values of the filter coefficients $B_{ap1}$ and/or $B_{ap\,2}$ by locating a minimum of the phase errors (e.g., as determined in block 872) in relation to a desired phase difference (e.g., $\pi/2$, etc.) between the surround channel and the front channel (as illustrated in expression (11')) In some embodiments, in block 874, the values of the filter coefficients $B_{ap1}$ and/or $B_{ap2}$ are obtained by solving one or more inverse problems in an iterative process and/or recursive process.

In some embodiments, one or more operations as described herein may be optional and/or may be omitted. In some embodiments, one or more operations as described herein may be repeated iteratively and/or recursively. For example, one or more of the operations, such as initializing values of the filter coefficients, calculating the phase responses, and minimizing the phase errors, performed in blocks 870, 872 and 874 may be repeated iteratively and/or recursively.

In block 876, the filter optimization system (700) determines whether the all-pass filters with the values of the filter coefficients $B_{ap1}$ and/or $B_{ap2}$—e.g., corresponding to the minimum of the phase errors—satisfies a third set of criteria. In some embodiments, the values of the filter coefficients $B_{ap1}$ and/or $B_{ap2}$ as determined in block 874 may be used to compute explicitly the phase response of the all-pass filters. The filter optimization system (700) may be configured to determine whether the explicitly computed phase response indicates that the all-pass filters provides acceptable linearity, group delay and/or other response characteristics, for example, by comparing quantities relating to the phase response with the third set of criteria.

If it is determined that the all-pass filter with the values of the filter coefficients $B_{ap1}$ and/or $B_{ap2}$ satisfies the third set of criteria, then the process flow (800-3) goes to block 878 in embodiments in which an optional high pass filter may be deployed in the channel (e.g., surround channel), and ends in other embodiments. Otherwise, the process flow (800-3) goes to block 880.

In block 880, the filter optimization system (700) increments one or both of the numbers of the second-order all-pass filters and the second-order all-pass filters by one or two integer values, for example, one (1). The process flow (800-3) goes to block 868 to perform/repeat the operations with the new number(s) of the all-path filters in the surround channel, as previously described.

In block 878, the filter optimization system (700) specifies an initial value for a high pass filter's order. For the purpose of illustration only, the high pass filter's Z transform is given as expressions (4') or (7').

In block 882, the filter optimization system (700) initializes the filter coefficients $B_{hp}$ of the high pass filter.

In block 884, the filter optimization system (700) computes phase errors relating to phase differences between the phase response of the surround channel and the phase response of the front channel based at least in part on the filter coefficients $B_{hp}$.

In block 886, the filter optimization system (700) determines values of the filter coefficients $B_{hp}$ by locating a global minimum of the phase errors (e.g., as determined in block 884). Additionally, optionally, or alternatively, in block 828, the values of the filter coefficients $B_{hp}$ are obtained by solving one or more inverse problems in an iterative process and/or recursive process.

In some embodiments, one or more operations as described herein may be optional and/or may be omitted. In some embodiments, one or more operations as described herein may be repeated iteratively and/or recursively. For example, one or more of the operations, such as initializing values of the filter coefficients, computing the phase errors, and minimizing the phase errors, performed in blocks 882, 884 and 886 may be repeated iteratively and/or recursively.

In block 888, the filter optimization system (700) determines whether the all-pass filters and the high pass filter satisfy a fourth set of criteria. In some embodiments, the values of the filter coefficients $B_{hp}$ as determined in block 886 may be used to compute explicitly the phase response of the surround channel. The filter optimization system (700) may be configured to determine whether the explicitly computed phase responses of the front channel and the surround channel indicate that the phase difference between the front channel and the surround channel is within one or more acceptable ranges (which may be specified with one or more criteria in the fourth set of criteria) over the bandwidth of audible frequencies. Additionally, optionally, or alternatively, the filter optimization system (700) may be configured to determine whether the explicitly computed phase response of the surround indicates that the surround channel provides acceptable linearity, group delay and/or other response characteristics, for example, by comparing quantities relating to the phase response with one or more criteria in the fourth set of criteria.

If it is determined that the phase responses of the surround channel and the front channel satisfy a fourth set of criteria, the process flow (800-3) ends. Otherwise, the process flow (800-3) goes to block 890.

In block 890, the filter optimization system (700) determines which of the all-pass filters and the high pass filter should increase its order. If it is determined that the order of the high pass filter should be increased, the process flow (800-3) goes to block 892. Otherwise, the process flow (800-3) goes to block 880.

In block 892, the filter optimization system (700) increments the order of the high pass filter by an integer value, for example, one (1). The process flow (800-3) goes to block 882 to perform/repeat the operations with the new order of the high path filter, as previously described.

6. Example Filter Networks

Techniques as described herein may be used to derive a phase shift network comprising one or more non-first-order all-pass recursive filters each of which is built on top of a plurality of first-order and/or second-order all-pass recursive filters. In some embodiments, the phase shift network may be configured to generate two phase responses in two different signal path such that a phase difference between the two phase responses is at or around a certain value (e.g., +/−90 degrees over a bandwidth of audio frequencies.

In an example, one of the two signal paths may simply have a delay line of N samples, while the other of the two signal paths may be configured with a non-first-order all-pass recursive filter generated with techniques as described herein.

In an example, each of the two signal paths may be configured with its own non-first-order all-pass recursive filter generated with techniques as described herein.

TABLE 1.1 illustrates example filter coefficients, of a phase shift network comprising two non-first-order all-pass recursive filters that generate a phase difference of 90 degrees between a surround signal path and a front signal path over a spectrum of audio frequencies, obtained after applying the techniques as described herein.

TABLE 1.1

| Filter | Surround | Front |
| --- | --- | --- |
| 1 | −0.99670588855362 | −0.125480748600752 |
| 2 | −0.97106146544739 | −0.008602401602620 |
| 3 | −0.85771200910643 | 0.016984707582113 |
| 4 | −0.40504521656354 | 0.012701237107611 |
| 5 | N/A | 0.012025101056122 |

Figure 9:
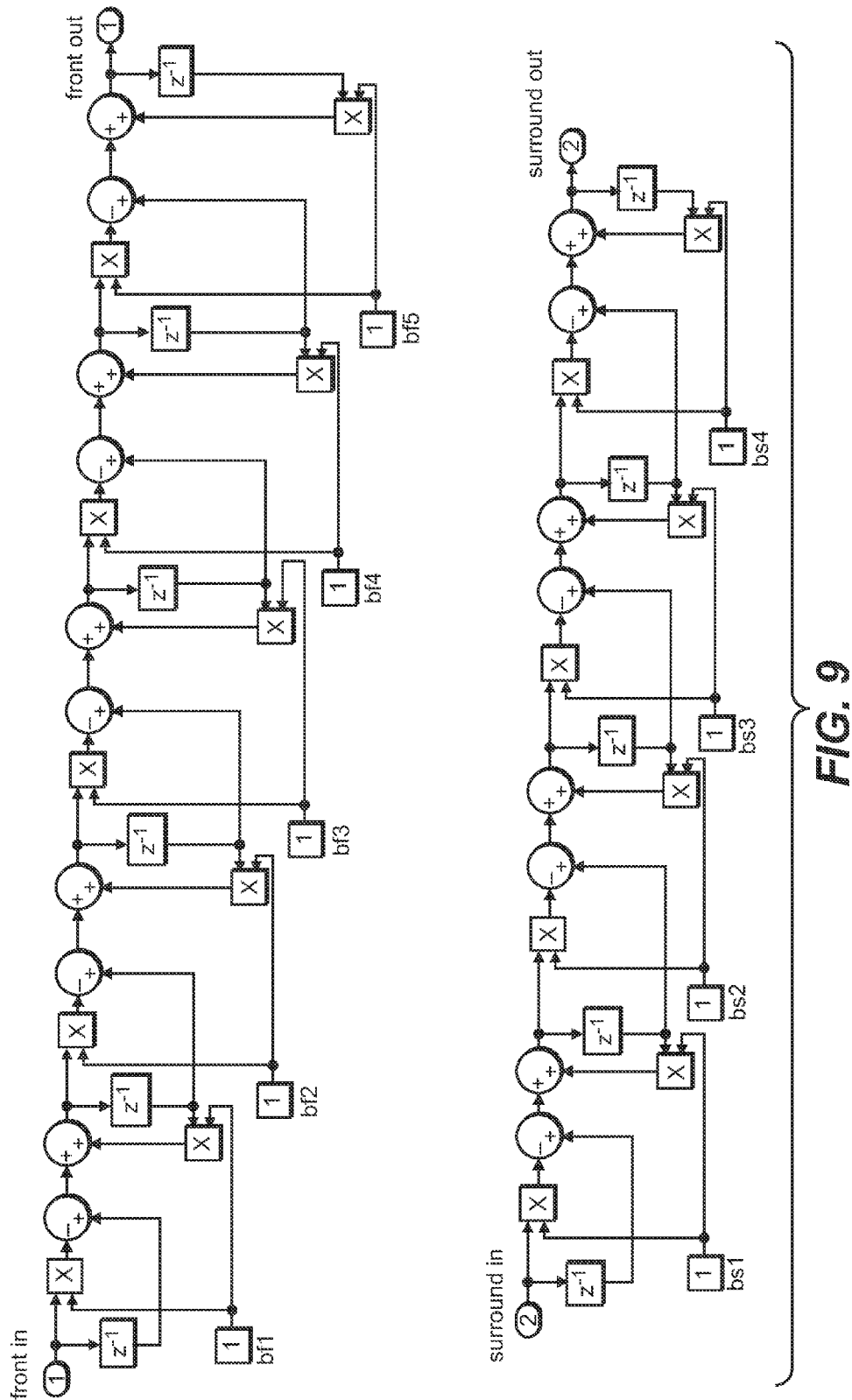
FIG. 9 illustrates a phase shift network that may be used to perform filtering operations relating to phase shift.
Figure 10:
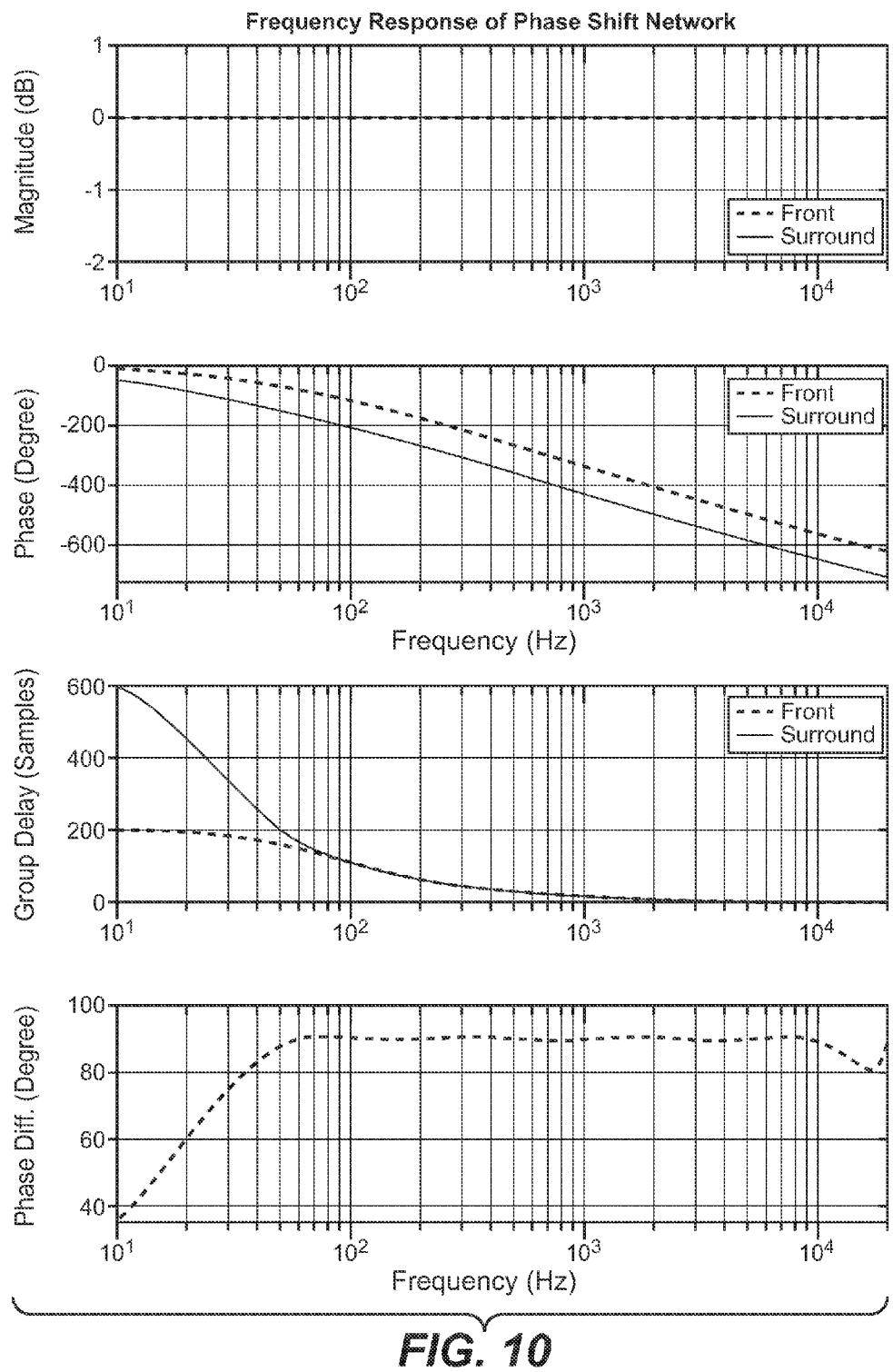
FIG. 10 illustrates a frequency response of a phase shift network.

FIG. 9 illustrates a phase shift network, which may use filter coefficients of TABLE 1.1, in accordance with an embodiment. As illustrated, a first phase shift filter for a front channel (or signal path) may comprise five first-order all-pass IIR filters, while a second phase shift filter for a surround channel (or signal path) may comprise four first-order IIR all-pass filters. FIG. 10 illustrates an example frequency response of such a phase shift network.

The phase shift network of FIG. 9 may be configured to use 5 and 4 words for filter coefficients and 5 to 15 and 5 to 10 words per channel for filter states, for front and surround channel respectively, as illustrated in TABLE 2. This is a significant reduction of memory usage in comparison with other techniques. For example, a FIR Hilbert filter may use 1024 (filter coefficients) and 2*1024 to 4*1024 (filter states) words for a surround channel in addition to the 639 to 1917 (delay line filter states) words for a front channel. An IIR Hilbert filter may use 22 (filter coefficients) and 18 to 54 (filter states) words for a surround channel in addition to the 1280 to 3840 (delay line filter states) words for a front channel.

TABLE 2

| | | words per channel | |
| --- | --- | --- | --- |
| Type | | Coeff. (ROM) | Data (RAM) |
| Hilbert FIR | Front | 0 | 639–1917 |
| | Back | 1024 | 2*1024–4*1024 |
| Hilbert IIR | front | 0 | 1280–3840 |
| | back | 22 | 18–54 |
| All-pass (DP600) | front | 4 | 5–15 |
| | back | 4 | 5–10 |
| Phase shift network of FIG. 9 | front | 5 | 5–15 |
| | back | 4 | 5–10 |
| Phase shift network of FIG. 12 | front | 0 | N–3N |
| | back | 4 + 4 | (K + 12) − 2(K + 12) |

The phase shift network of FIG. 9 has relatively low computational complexity as compared with other techniques, as illustrated in TABLE 3. In TABLE 3, $N_b$ represents a block size. $N_L$ represents a look-ahead size, and $N_{fft}$ represents an FFT/IFFT size, N is the delay line length for the front channel, and K represents a delay line length for the surround channel. The number of data moves for filters other than Hilbert filters is expected to be relatively small in comparison with those of Hilbert filters.

TABLE 3

Figure 12:
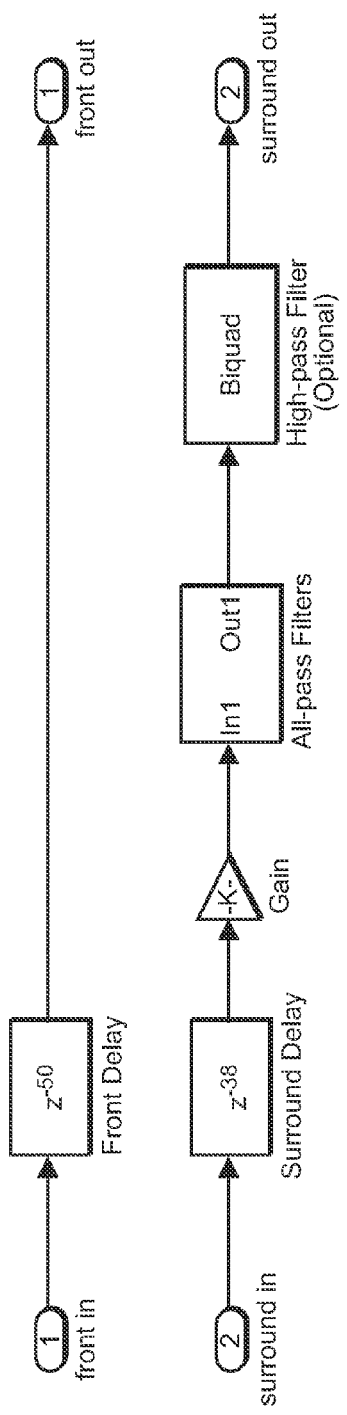
FIG. 12 illustrates a phase shift network that may be used to perform filtering operations relating to phase shift.

| Type | Number of Filtering Operations (MAC) | Number of Data Move |
| --- | --- | --- |
| Hilbert FIR | $N_{fft} + 2*N_{fft}*\log_2(N_{fft})$ | K |
| Hilbert IIR* | 17* $N_b$ | $N_b + N_L + N$ |
| All-pass (DP600) | 16* $N_b$ | |
| Phase shift network of FIG. 9 | 18* $N_b$ | |
| Phase shift network of FIG. 12 | 12*$N_b$ (surround channel) | N ($N_{min} = 12$) |

As illustrated in TABLE 4, the phase shift network of FIG. 9 has relatively high performance, low computational complexity, and low delay, as compared with other techniques. In some embodiments, the group delay at small frequencies (e.g., < or <<100 Hz) may be made smaller for both front and surround channels. In some embodiments, the ripples at large frequencies (e.g., > or >>10 kHz) may also be made smaller, for example, by increasing one or more filter orders ($N_m$ and/or $N_s$) in a phase shift network implemented under techniques as described herein.

TABLE 4

| Type | Magnitude Response | Phase | Phase diff. | Group Delay |
| --- | --- | --- | --- | --- |
| Hilbert FIR | Flat with fc = 30 Hz | Linear | Flat | 639 |
| Hilbert IIR | Ripple in low frequency | Nearly Linear | Ripple | 1280 |
| All-pass (DP600) | Flat | Nearly Linear | Flat, roll off at 10 kHz | <100 (f > 100 Hz) |
| Phase shift network of FIG. 9 | Flat | Nearly Linear | Flat, roll off at 20 kHz | Constant and configurable |
| Phase shift network of FIG. 12 | Flat | Linear (front channel) Nearly Linear (surround channel) | Flat with equal ripples | Constant and configurable |

TABLE 1.2 illustrates example filter coefficients, of a phase shift network comprising a front channel with only a delay line and a surround channel with a delay line, second-order all-pass recursive filters, and (optionally) a biquad type high pass filter that generates a phase difference of 90 degrees between the front channel and the surround channel over a spectrum of audio frequencies, obtained after applying the techniques as described herein.

TABLE 1.2

| $2^{nd}$ order all-pass filters | Initial coefficient values | Optimized coefficient values |
| --- | --- | --- |
| 1 | −0.977093805420138 | 0.005807751102922 |
| 2 | 0.099900000000000 | |
| 3 | −0.014083583615967 | 0.006006567679576 |
| 4 | 0.018861942342812 | |

TABLE 1.2-continued

| 2$^{nd}$ order all-pass filters | Initial coefficient values | Optimized coefficient values |
|---|---|---|
| 5 | 0.0754477693712497 | 0.006038140556772 |
| 6 | 0.377238846856248 | −0.003892453672807 |

Figure 14:
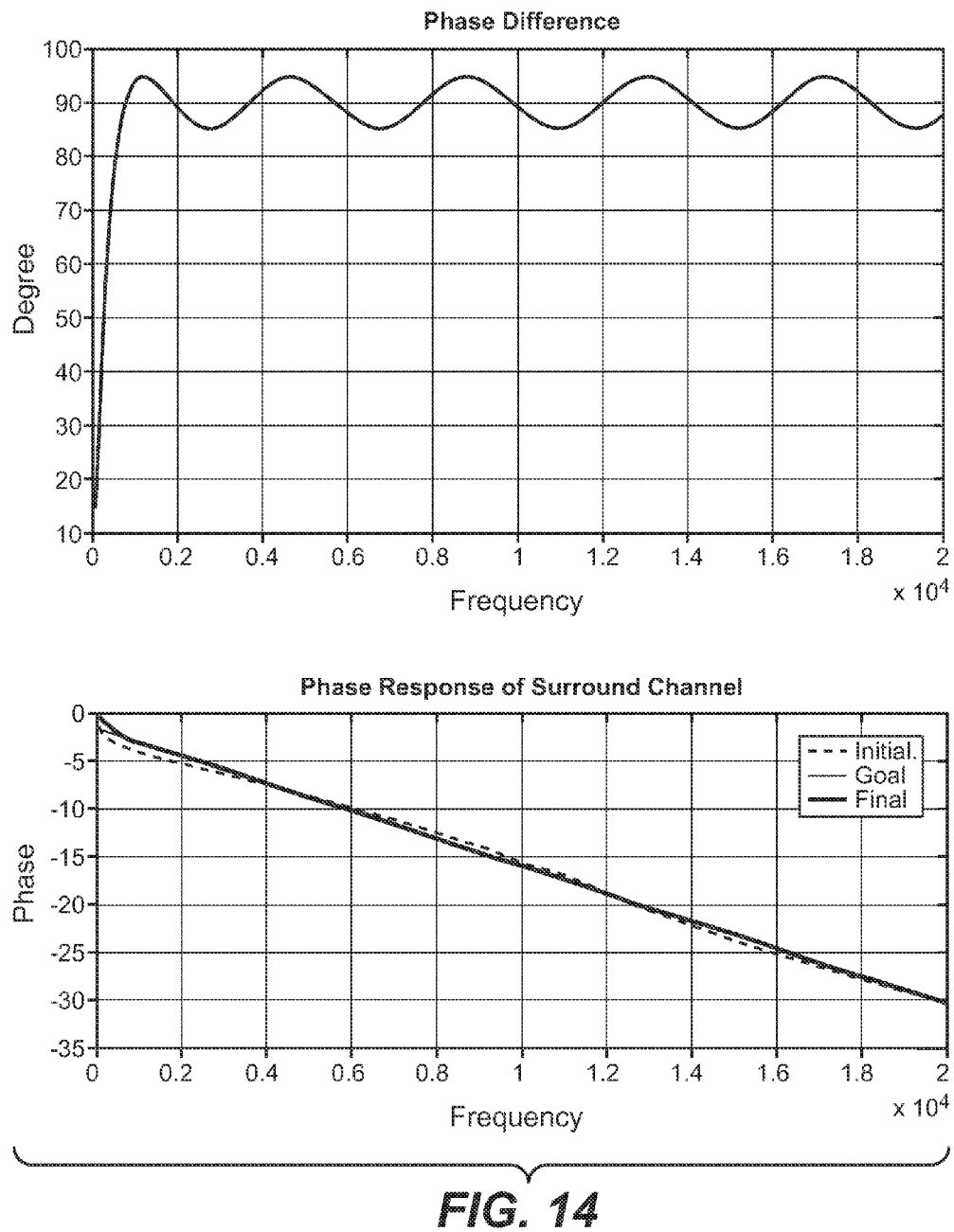
FIG. 14 illustrates an example phase difference between two signal paths and frequency response of one of the signal paths produced by a phase shift network.

FIG. 12 illustrates a phase shift network, which may use filter coefficients of TABLE 1.2 for second-order all-pass filters in a non-delay-line-only channel (e.g., surround channel, etc.), in accordance with an embodiment. As illustrated, the front channel (or signal path) comprises only a delay line, while the surround channel comprises a delay line, second-order all-pass filters, and (optionally) a high pass filter. FIG. 14 illustrates example phase difference between the front channel and the surround channel and frequency response of the surround channel produced by such a phase shift network.

Figure 13:
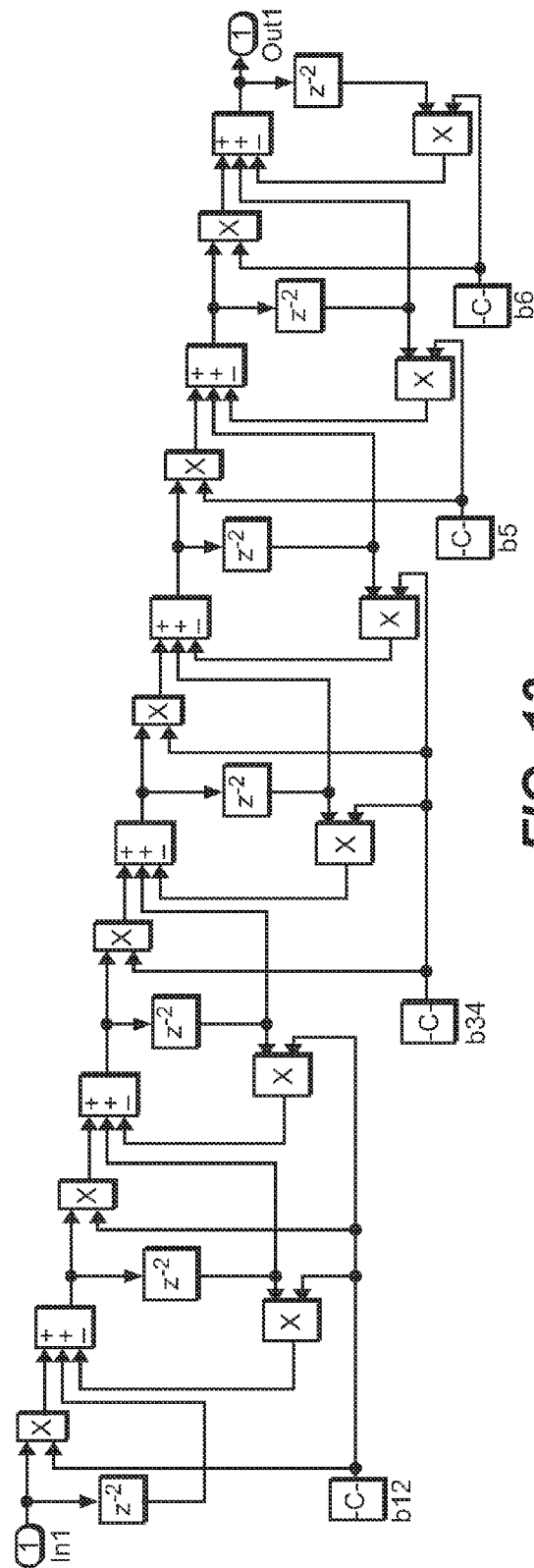
FIG. 13 illustrates an example second-order all-pass filters phase shift network that may be used to perform filtering operations relating to phase shift.

The all-pass filter coefficients for the surround channel(s) as illustrated in TABLE 1.2 are obtained after 63 iterations, for the specified group delay of 50 samples. The all-pass filters have a gain factor of −0.058716913612595, and may be provided by a separate amplifier (corresponding to the gain factor) and a component filter network as illustrated in FIG. 13. Optimized values for the first and second filter coefficients are identical. Optimized values for the third and fourth filter coefficients are also identical.

The phase shift network of FIG. 12 may be configured to use 4 words for filter coefficients, four words for gain factors, and (K+12) to 2*(K+12) words per channel for filter states, for the surround channel, and to use 0 words for filter coefficients and N to 3N for the front channel, as illustrated in TABLE 2. This is a significant reduction of memory usage in comparison with other techniques.

The number of filtering operations and data moves for the phase shift network of FIG. 12 is illustrated in TABLE 3. The number of filtering operations and data moves as compared with other approaches such as Hilbert IIR/FIR is minimal.

As illustrated in TABLE 4, the phase shift network of FIG. 12 has relatively high performance, low computational complexity, and low delay, as compared with other techniques. In some embodiments, the group delay may be made smaller, for example, by increasing one or more filter orders ($M_{ap1}$ and/or $M_{ap2}$) in a phase shift network implemented under techniques as described herein.

7. Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 11:
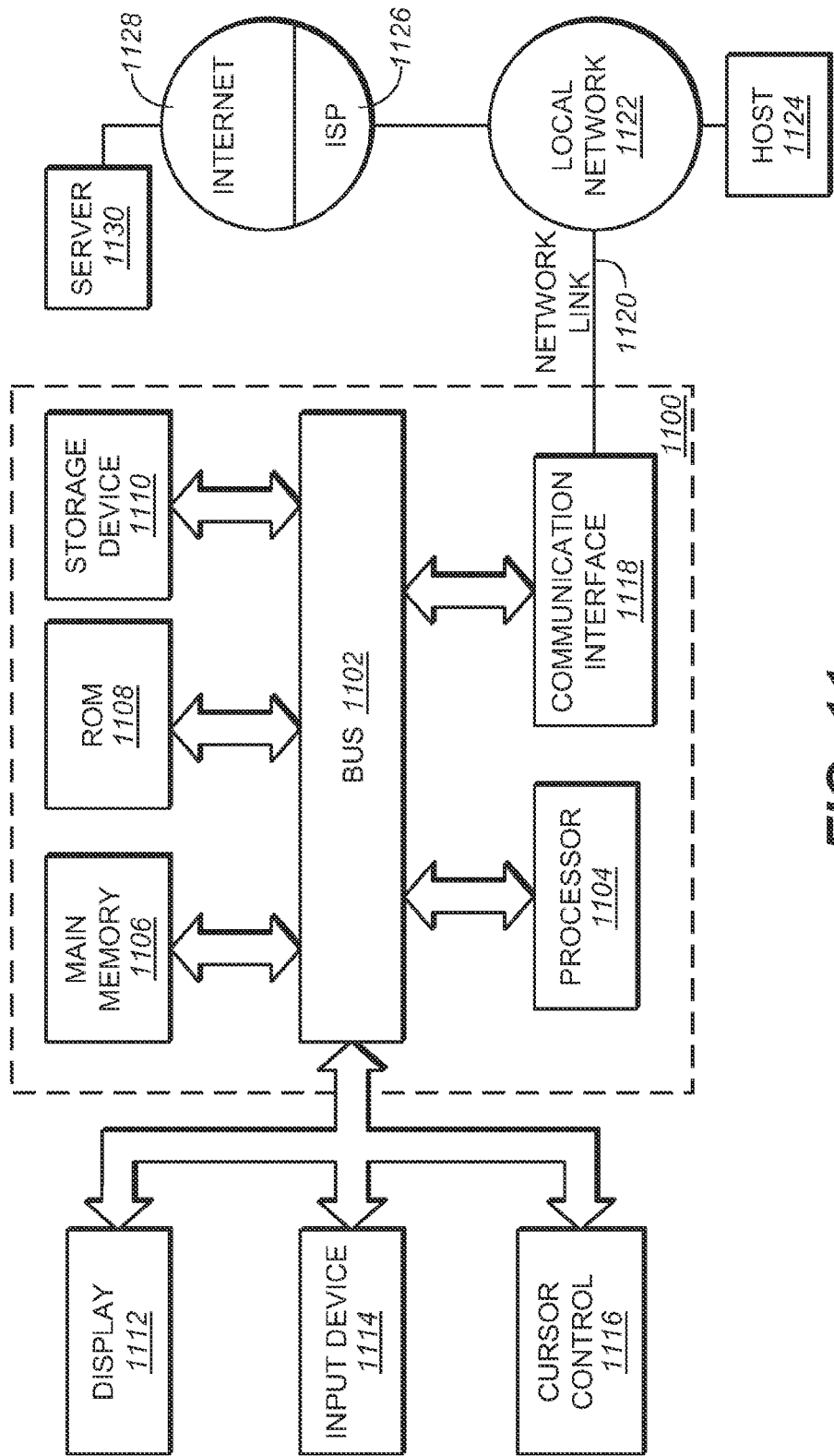
FIG. 11 illustrates an example hardware platform on which a computer or a computing device as described herein may be implemented, according to an embodiment of the present invention.

For example, FIG. 11 is a block diagram that illustrates a computer system 1100 upon which an example embodiment of the invention may be implemented. Computer system 1100 includes a bus 1102 or other communication mechanism for communicating information, and a hardware processor 1104 coupled with bus 1102 for processing information. Hardware processor 1104 may be, for example, a general purpose microprocessor.

Computer system 1100 also includes a main memory 1106, such as a random access memory (RAM) or other dynamic storage device, coupled to bus 1102 for storing information and instructions to be executed by processor 1104. Main memory 1106 also may be used for storing temporary variables or other intermediate information during execution of instructions to be executed by processor 1104. Such instructions, when stored in non-transitory storage media accessible to processor 1104, render computer system 1100 into a special-purpose machine that is customized to perform the operations specified in the instructions.

Computer system 1100 further includes a read only memory (ROM) 1108 or other static storage device coupled to bus 1102 for storing static information and instructions for processor 1104. A storage device 1110, such as a magnetic disk or optical disk, is provided and coupled to bus 1102 for storing information and instructions.

Computer system 1100 may be coupled via bus 1102 to a display 1112, such as a liquid crystal display, for displaying information to a computer user. An input device 1114, including alphanumeric and other keys, is coupled to bus 1102 for communicating information and command selections to processor 1104. Another type of user input device is cursor control 1116, such as a mouse, a trackball, or cursor direction keys for communicating direction information and command selections to processor 1104 and for controlling cursor movement on display 1112. This input device typically has two degrees of freedom in two axes, a first axis (e.g., x) and a second axis (e.g., y), that allows the device to specify positions in a plane.

Computer system 1100 may implement the techniques described herein using customized hard-wired logic, one or more ASICs or FPGAs, firmware and/or program logic which in combination with the computer system causes or programs computer system 1100 to be a special-purpose machine. According to one embodiment, the techniques herein are performed by computer system 1100 in response to processor 1104 executing one or more sequences of one or more instructions contained in main memory 1106. Such instructions may be read into main memory 1106 from another storage medium, such as storage device 1110. Execution of the sequences of instructions contained in main memory 1106 causes processor 1104 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 1110. Volatile media includes dynamic memory, such as main memory 1106. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1102. Transmission media can also take the form of acoustic or light waves, such as those generated during radio-wave and infra-red data communications.

Various forms of media may be involved in carrying one or more sequences of one or more instructions to processor 1104 for execution. For example, the instructions may initially be carried on a magnetic disk or solid state drive of a remote computer. The remote computer can load the instructions into its dynamic memory and send the instructions over a telephone line using a modem. A modem local to computer system 1100 can receive the data on the telephone line and use an infra-red transmitter to convert the data to an infra-red signal. An infra-red detector can receive the data carried in the infra-red signal and appropriate circuitry can place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

Computer system 1100 also includes a communication interface 1118 coupled to bus 1102. Communication interface 1118 provides a two-way data communication coupling to a network link 1120 that is connected to a local network 1122. For example, communication interface 1118 may be an integrated services digital network (ISDN) card, cable modem, satellite modem, or a modem to provide a data communication connection to a corresponding type of telephone line. As another example, communication interface 1118 may be a local area network (LAN) card to provide a data communication connection to a compatible LAN. Wireless links may also be implemented. In any such implementation, communication interface 1118 sends and receives electrical, electromagnetic or optical signals that carry digital data streams representing various types of information.

Network link 1120 typically provides data communication through one or more networks to other data devices. For example, network link 1120 may provide a connection through local network 1122 to a host computer 1124 or to data equipment operated by an Internet Service Provider (ISP) 1126. ISP 1126 in turn provides data communication services through the world wide packet data communication network now commonly referred to as the "Internet" 1128. Local network 1122 and Internet 1128 both use electrical, electromagnetic or optical signals that carry digital data streams. The signals through the various networks and the signals on network link 1120 and through communication interface 1118, which carry the digital data to and from computer system 1100, are example forms of transmission media.

Computer system 1100 can send messages and receive data, including program code, through the network(s), network link 1120 and communication interface 1118. In the Internet example, a server 1130 might transmit a requested code for an application program through Internet 1128, ISP 1126, local network 1122 and communication interface 1118.

The received code may be executed by processor 1104 as it is received, and/or stored in storage device 1110, or other non-volatile storage for later execution.

8. Equivalents, Extensions, Alternatives and Miscellaneous

In the foregoing specification, example embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method, comprising:
   determining a target phase response for an all-pass recursive filter, the all-pass recursive filter being representable with a transfer function having N zeros and N poles, the N zeros having a one to one correspondence relationship with the N poles;
   specifying an initial value of N;
   (a) identifying, based at least in part on the target phase response, a set of optimized values for a set of filter coefficients for the all-pass recursive filter; and
   (b) determining whether the all-pass recursive filter with the set of optimized values for the set of filter coefficients satisfies one or more criteria;
   wherein the above steps of determining, specifying, (a) identifying, and (b) determining are performed with one or more computing devices;
   in response to determining that the all-pass recursive filter with the set of optimized values for the set of filter coefficients does not satisfy the one or more criteria, incrementing N and repeating steps (a) and (b);
   in response to determining that the all-pass recursive filter with the set of optimized values for the set of filter coefficients satisfies the one or more criteria, causing the all-pass recursive filter to be implemented in one or more semiconductor integrated circuits in a media processor, the media processor using the all-pass recursive filter to process first media samples in a first signal path of two or more signal paths, while the media processor is processing second media samples without the all-pass recursive filter in a second different signal path of the two or more signal paths.

2. The method as recited in claim 1, wherein the all-pass recursive filter comprises first-order all-pass filters and second-order all-pass filters, and wherein specifying an initial value of N includes specifying one or both of the number of first-order all-pass filters or the number of second-order all-pass filters.

3. The method as recited in claim 1, wherein the all-pass recursive filter comprises first-order all-pass filters and second-order all-pass filters, and wherein incrementing N includes incrementing at least one of the number of first-order all-pass filters or the number of second-order all-pass filters.

4. The method as recited in claim 1, further comprising:
in response to determining that the all-pass recursive filter with the set of optimized values for the set of filter coefficients satisfies the one or more criteria, performing:
  determining another target phase response for a combination of the all-pass recursive filter and another all-pass recursive filter, the other all-pass recursive filter being representable with another transfer function having N' zeros and N', the N' zeros having a 1-1 correspondence relationship with the N' poles;
  specifying an initial value of N';
  (c) identifying, based at least in part on the other target phase response, another set of optimized values for another set of filter coefficients for the other all-pass recursive filter; and
  (d) determining whether the all-pass recursive filter with the set of optimized values for the set of filter coefficients and the other all-pass recursive filter with the other set of optimized values for the other set of filter coefficients satisfy one or more other criteria.

5. The method as recited in claim 4, further comprising:
in response to determining that the all-pass recursive filter with the set of optimized values for the set of filter coefficients and the other all-pass recursive filter with the other set of optimized values for the other set of filter coefficients do not satisfy the one or more other criteria, incrementing N and repeating steps (a) and (b) of claim 1.

6. The method as recited in claim 4, further comprising:
in response to determining that the all-pass recursive filter with the set of optimized values for the set of filter coefficients and the other all-pass recursive filter with the other set of optimized values for the other set of filter coefficients do not satisfy the one or more other criteria, incrementing N' and repeating steps (c) and (d) of claim 4.

7. The method as recited in claim 4,
wherein the second media samples are processed in the second different signal path of the two or more signal paths with the other all-pass recursive filter.

8. The method as recited in claim 7, further comprising inserting a delay line as a part of one of the first signal path or the second signal path.

9. The method as recited in claim 1, further comprising:
in response to determining that the all-pass recursive filter with the set of optimized values for the set of filter coefficients satisfies the one or more criteria, performing:
  determining a new target phase response for a combination of the all-pass recursive filter and a high pass filter, the high pass filter being representable with another transfer function of an order N';
  specifying an initial value of N';
  (c) identifying, based at least in part on the new target phase response, another set of optimized values for another set of filter coefficients for the high pass filter; and
  (d) determining whether the all-pass recursive filter with the set of optimized values for the set of filter coefficients and the high pass filter with the other set of optimized values for the other set of filter coefficients satisfy one or more other criteria.

10. The method as recited in claim 9, further comprising:
in response to determining that the all-pass recursive filter with the set of optimized values for the set of filter coefficients and the high pass filter with the other set of optimized values for the other set of filter coefficients do not satisfy the one or more other criteria, incrementing N and repeating steps (a) and (b) of claim 1.

11. The method as recited in claim 9, further comprising:
in response to determining that the all-pass recursive filter with the set of optimized values for the set of filter coefficients and the high pass filter with the other set of optimized values for the other set of filter coefficients do not satisfy the one or more other criteria, incrementing N' and repeating steps (c) and (d) of claim 9.

12. The method as recited in claim 9,
wherein the second media samples are processed in the second different signal path of the two or more signal paths with only a delay line.

13. The method as recited in claim 1,
wherein the second media samples are processed with a delay line without another all-pass recursive filter.

14. The method as recited in claim 1, wherein determining whether the all-pass recursive filter with the set of optimized values for the set of filter coefficients satisfies one or more criteria comprises:
  determining phase errors relating to at least one of the target phase response for the all-pass recursive filter or phase responses calculated based on a plurality of sets of values for the set of filter coefficients for the all-pass recursive filter; and
  minimizing the phase errors to identify the set of optimized values, among the plurality of sets of values, for the set of filter coefficients.

15. The method as recited in claim 14, further comprising computing the phase errors over a plurality of discrete audio frequencies.

16. The method as recited in claim 14, comprising computing the phase errors over a bandwidth of audio frequencies.

17. The method as recited in claim 1, wherein the one or more criteria comprises one or more maximum phase errors at one or more of: audio frequencies between 20 Hz and 400 Hz, audio frequencies between 400 Hz and 10,000 Hz, audio frequencies between 10,000 Hz and 25,000 Hz, or audio frequencies greater than 25,000 Hz.

18. The method as recited in claim 1, wherein the one or more criteria comprises one or more maximum group delays at one or more of: audio frequencies between 20 Hz and 400 Hz, audio frequencies between 400 Hz and 10,000 Hz, audio frequencies between 10,000 Hz and 25,000 Hz, or audio frequencies greater than 25,000 Hz.

19. The method as recited in claim 1, further comprising determining the target phase response, for the all-pass recursive filter, based at least in part on a target phase difference between two outputs from the two signal paths.

20. The method as recited in claim 1, further comprising converting one or more input media samples represented, received, transmitted, or stored with one or more input media signals into one or more output media samples represented, received, transmitted, or stored with one or more output media signals with the all-pass recursive filter.

21. The method as recited in claim 20, wherein at least one of the input media signals or the output media signals comprises a video signal.

22. A non-transitory computer readable storage medium, storing software instructions, which when executed by one or more processors cause performance of the method as recited in claim 1.

23. A computing device comprising one or more processors and one or more non-transitory computer readable storage media storing a set of instructions which, when executed by the one or more processors, cause performance of the method as recited in claim 1.

\* \* \* \* \*